(12) United States Patent
Noudo

(10) Patent No.: US 11,557,619 B2
(45) Date of Patent: Jan. 17, 2023

(54) IMAGE SENSOR AND IMAGING DEVICE

(71) Applicant: SONY SEMICONDUCTOR SOLUTIONS CORPORATION, Kanagawa (JP)

(72) Inventor: Shinichiro Noudo, Kumamoto (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 210 days.

(21) Appl. No.: 16/955,577

(22) PCT Filed: Nov. 2, 2018

(86) PCT No.: PCT/JP2018/040877
§ 371 (c)(1),
(2) Date: Jun. 18, 2020

(87) PCT Pub. No.: WO2019/130820
PCT Pub. Date: Jul. 4, 2019

(65) Prior Publication Data
US 2020/0321376 A1 Oct. 8, 2020

(30) Foreign Application Priority Data
Dec. 26, 2017 (JP) .............................. JP2017-249086

(51) Int. Cl.
*H01L 27/146* (2006.01)
(52) U.S. Cl.
CPC .... *H01L 27/14623* (2013.01); *H01L 27/1464* (2013.01); *H01L 27/14612* (2013.01); *H01L 27/14627* (2013.01)
(58) Field of Classification Search
CPC ......... H01L 27/14623; H01L 27/14612; H01L 27/14627; H01L 27/1464; H01L 27/14603;
(Continued)

(56) References Cited

U.S. PATENT DOCUMENTS

2008/0135963 A1  6/2008 Akiyama
2010/0112747 A1  5/2010 Akiyama
(Continued)

FOREIGN PATENT DOCUMENTS

CN   101197387 A   6/2008
CN   101789438 A   7/2010
(Continued)

OTHER PUBLICATIONS

International Search Report and Written Opinion of PCT Application No. PCT/JP2018/040877, dated Feb. 5, 2019, 09 pages of ISRWO.

*Primary Examiner* — Douglas W Owens
(74) *Attorney, Agent, or Firm* — Chip Law Group

(57) ABSTRACT

The incidence of incident light transmitted through a photoelectric conversion unit onto a charge holding unit, a pixel in the adjacency, and the like can be blocked in a pixel. An image sensor includes a pixel, a wiring layer, and an incident light attenuation unit. The pixel includes a photoelectric conversion unit that is formed in a semiconductor substrate and performs photoelectric conversion based on incident light, and a pixel circuit that generates an image signal according to a charge generated by the photoelectric conversion. The wiring layer is arranged on a surface of the semiconductor substrate different from a surface onto which the incident light is incident, and transports either the image signal or a signal applied to the pixel circuit. The incident light attenuation unit attenuates the incident light transmitted through the photoelectric conversion unit.

9 Claims, 20 Drawing Sheets

(58) Field of Classification Search
CPC ... H01L 27/1463; H01L 27/146; H04N 5/357; H04N 5/369
See application file for complete search history.

(56) References Cited

U.S. PATENT DOCUMENTS

| | | | |
|---|---|---|---|
| 2012/0008026 A1* | 1/2012 | Akiyama | H01L 27/1464 257/E31.128 |
| 2012/0062777 A1* | 3/2012 | Kobayashi | H01L 27/14612 348/E5.091 |
| 2013/0037902 A1* | 2/2013 | Nakazawa | H01L 27/14627 257/E31.127 |
| 2013/0070131 A1 | 3/2013 | Ohkubo et al. | |
| 2015/0124140 A1 | 5/2015 | Ohkubo et al. | |
| 2015/0311245 A1* | 10/2015 | Yamazaki | H01L 27/1225 257/43 |
| 2015/0349015 A1* | 12/2015 | Yamaguchi | H01L 27/14603 438/70 |
| 2017/0062505 A1* | 3/2017 | Takahashi | H01L 27/14689 |
| 2017/0229503 A1 | 8/2017 | Suzuki et al. | |
| 2017/0244920 A1 | 8/2017 | Ohkubo et al. | |

FOREIGN PATENT DOCUMENTS

| | | |
|---|---|---|
| CN | 103000644 A | 3/2013 |
| CN | 106796943 A | 4/2016 |
| JP | 2008-147333 A | 6/2008 |
| JP | 2013-065688 A | 4/2013 |
| JP | 2015-228510 A | 12/2015 |
| JP | 2016-082133 A | 5/2016 |
| KR | 10-2008-0053228 A | 6/2008 |
| TW | 200836336 A | 9/2008 |
| WO | 2016/063727 A1 | 4/2016 |

* cited by examiner

IMAGE SENSOR AND IMAGING DEVICE

CROSS REFERENCE TO RELATED APPLICATIONS

This application is a U.S. National Phase of International Patent Application No. PCT/JP2018/040877 filed on Nov. 2, 2018, which claims priority benefit of Japanese Patent Application No. JP 2017-249086 filed in the Japan Patent Office on Dec. 26, 2017. Each of the above-referenced applications is hereby incorporated herein by reference in its entirety.

TECHNICAL FIELD

The present technology relates to an image sensor and an imaging device. In more detail, the present technology relates to back-illuminated image sensor and imaging device in which a wiring layer is formed on a surface of a semiconductor substrate different from a surface onto which light is incident.

BACKGROUND ART

Conventionally, among image sensors in which pixels configured to generate image signals by photoelectrically converting incident light are two-dimensionally arranged, an image sensor having a wiring layer formed on a surface of a semiconductor substrate on which a photoelectric conversion unit configured to perform photoelectric conversion is formed, the surface being different from a surface irradiated with incident light, is used. Such an image sensor is called a back-illuminated image sensor. Since the incident light arrives at the photoelectric conversion unit without being restricted by the wiring layer, the aperture ratio of the pixel can be improved. In such a pixel of the image sensor, after a predetermined exposure time has elapsed, a charge generated by the above-mentioned photoelectric conversion unit is transferred to and held in a floating diffusion formed in a diffusion layer of the semiconductor substrate. An image signal of a voltage according to the amount of the held charges is generated, and read out from the pixel to be output.

In the above-described back-illuminated image sensor, there is a difficulty in that, when light incident from the back surface of the semiconductor substrate is transmitted through the semiconductor substrate without being photo-electrically converted in the photoelectric conversion unit, the light is reflected to the semiconductor substrate side by the wiring layer or the like arranged on the front surface side. This reflected light can be optical noise. For example, in a case where the reflected light is incident onto the photoelectric conversion unit of a pixel in the adjacency, a signal based on the reflected light is superimposed on the image signal of the pixel in the adjacency, and crosstalk is produced.

Furthermore, in a general image sensor, line exposure sequential readout (rolling shutter) is adopted. This is a technique of performing the exposure and the transfer of the image signal by varying the time for each row, and this technique sequentially performs the exposure by varying the start time and end time of the exposure for each row, while reading out the image signals in units of rows from the pixels without interruption. While the configuration of the pixel can be simplified, a phenomenon called focal plane distortion occurs in which an object moving at high speed is deformed due to a time difference between the start and end of exposure for each row. In addition, in a case where illumination with a very short light emission period, such as a flash, is used, a phenomenon called a flash band that causes a difference in luminance depending on the location on a screen also occurs. As described above, in the rolling shutter type image sensor, the image quality after imaging is deteriorated.

A global shutter has been proposed as a driving method for solving such a difficulty in the rolling shutter type. In this global shutter, a charge holding unit is arranged between the above-described photoelectric conversion unit and floating diffusion, and after exposing all pixels simultaneously, charges generated by photoelectric conversion are collectively transferred to and hold in the charge holding unit. Thereafter, the transfer of the charges from the charge holding unit to the floating diffusion, the generation of image signals, and the readout of the image signals from the pixels are sequentially performed for each row. As described above, in an image sensor of the global shutter type, since all pixels can be exposed simultaneously, it is possible to prevent the occurrence of the focal plane distortion and the like.

Even in this global shutter type image sensor, the influence of the reflected light is produced. Specifically, when reflected light is incident on a pixel in the adjacency, crosstalk is produced as in the rolling shutter type. Furthermore, noise occurs also in a case where reflected light enters the own charge holding unit of the pixel and causes photoelectric conversion. In the global shutter type image sensor, such light leakage to the charge holding unit is managed as parasitic light sensitivity (PLS), and an extremely low PLS is required. Thus, in order to block crosstalk and the like of reflected light, an image sensor has been proposed in which a light-shielding portion is arranged within a substrate to achieve optical isolation (for example, see Patent Document 1). In relation to this prior art, an image sensor that further arranges a front surface-side light-shielding portion between a charge holding unit and a wiring layer to prevent reflected light from being incident on the charge holding unit has also been proposed.

CITATION LIST

Patent Document

Patent Document 1: Japanese Patent Application Laid-Open No. 2015-228510

SUMMARY OF THE INVENTION

Problems to be Solved by the Invention

In the above-described image sensor, a transistor that transfers a charge generated by photoelectric conversion is arranged. In the above-described light-shielding portion of the prior art, an opening portion is formed in the region of the light-shielding portion, and a channel region of the transistor that transfers a charge is arranged in the formed opening portion. For this reason, in the prior art, there is a difficulty in that it is not possible to block the reflected light from being incident onto the photoelectric conversion unit or the charge holding unit of an adjacent pixel through the opening portion of the light-shielding portion, and the image quality of the image signal is deteriorated.

The present technology has been made in view of the above-described difficult points, and an object thereof is to reduce, in a pixel, the incidence of incident light transmitted through a photoelectric conversion unit onto a charge holding unit or a pixel in the adjacency or the like, and to prevent deterioration in image quality.

Solutions to Problems

The present technology has been made to eliminate the above-described difficult points, and a first aspect thereof is an image sensor including: a pixel including a photoelectric conversion unit that is formed in a semiconductor substrate and performs photoelectric conversion based on incident light, and a pixel circuit that generates an image signal according to a charge generated by the photoelectric conversion; a wiring layer that is arranged on a surface of the semiconductor substrate different from a surface onto which the incident light is incident and transports either the image signal or a signal applied to the pixel circuit; and an incident light attenuation unit that attenuates the incident light transmitted through the photoelectric conversion unit. This brings about an action that incident light transmitted through the photoelectric conversion unit is attenuated by the incident light attenuation unit. It is assumed that optical noise based on incident light transmitted through the photoelectric conversion unit is lowered.

Furthermore, in this first aspect, the incident light attenuation unit may include: a lid portion having an opening portion that is arranged between the semiconductor substrate and the wiring layer and allows light transmitted through the photoelectric conversion unit to be incident; and a wall portion enclosing the opening portion. This brings about an action that the incident light attenuation unit is formed by the lid portion and the wall portion.

In addition, in this first aspect, the incident light attenuation unit may include the wall portion formed simultaneously with the wiring layer. This brings about an action that the wall portion of the incident light attenuation unit is formed simultaneously with the wiring layer.

In addition, in this first aspect, the incident light attenuation unit may further include a bottom portion adjacent to the wall portion and arranged to face the lid portion. This brings about an action that the incident light attenuation unit is formed by the lid portion, the wall portion, and the bottom portion.

In addition, in this first aspect, the incident light attenuation unit may include the bottom portion formed simultaneously with the wiring layer. This brings about an action that the bottom portion of the incident light attenuation unit is formed simultaneously with the wiring layer.

In addition, in this first aspect, the opening portion may be arranged in the incident light attenuation unit at a position shifted according to an incident angle of the incident light. This brings about an action that the position of the opening portion of the incident light attenuation unit is adjusted according to the incident angle of the incident light onto the pixel.

In addition, in this first aspect, the pixel circuit may include a charge holding unit that holds the generated charge, and an image signal generation unit that generates an image signal on the basis of the held charge. This brings about an action that an image signal according to the charge held in the charge holding unit is generated.

In addition, this first aspect may further include a light-shielding wall that is arranged between the photoelectric conversion unit and the charge holding unit, and provides shielding from the incident light. This brings about an action that shielding from light is provided between the photoelectric conversion unit and the charge holding unit.

In addition, this first aspect may further include a shading film that is arranged near the charge holding unit on a surface of the semiconductor substrate onto which the incident light is incident, and provides shielding from the incident light. This brings about an action that the charge holding unit is shielded from the incident light.

Furthermore, a second aspect of the present technology is an imaging device including: a pixel including a photoelectric conversion unit that is formed in a semiconductor substrate and performs photoelectric conversion based on incident light, and a pixel circuit that generates an image signal according to a charge generated by the photoelectric conversion; a wiring layer that is arranged on a surface of the semiconductor substrate different from a surface onto which the incident light is incident and transports either the image signal or a signal applied to the pixel circuit; an incident light attenuation unit that attenuates the incident light transmitted through the photoelectric conversion unit; and a processing circuit that processes the transported image signal. This brings about an action that incident light transmitted through the photoelectric conversion unit is attenuated by the incident light attenuation unit. It is assumed that optical noise based on incident light transmitted through the photoelectric conversion unit is lowered.

Effects of the Invention

According to the present technology, the outstanding effect of reducing, in a pixel, the incidence of incident light transmitted through a photoelectric conversion unit onto a charge holding unit or a pixel in the adjacency or the like, and preventing deterioration in image quality is exhibited.

BRIEF DESCRIPTION OF DRAWINGS

FIGS. 10A and 11B are diagrams illustrating a method of manufacturing the image sensor according to the first embodiment of the present technology.

FIGS. 11A, 11B, 11C, and 11D are diagrams illustrating configuration examples of an incident light attenuation unit according to a first modification of the first embodiment of the present technology.

MODE FOR CARRYING OUT THE INVENTION

Figure 1:
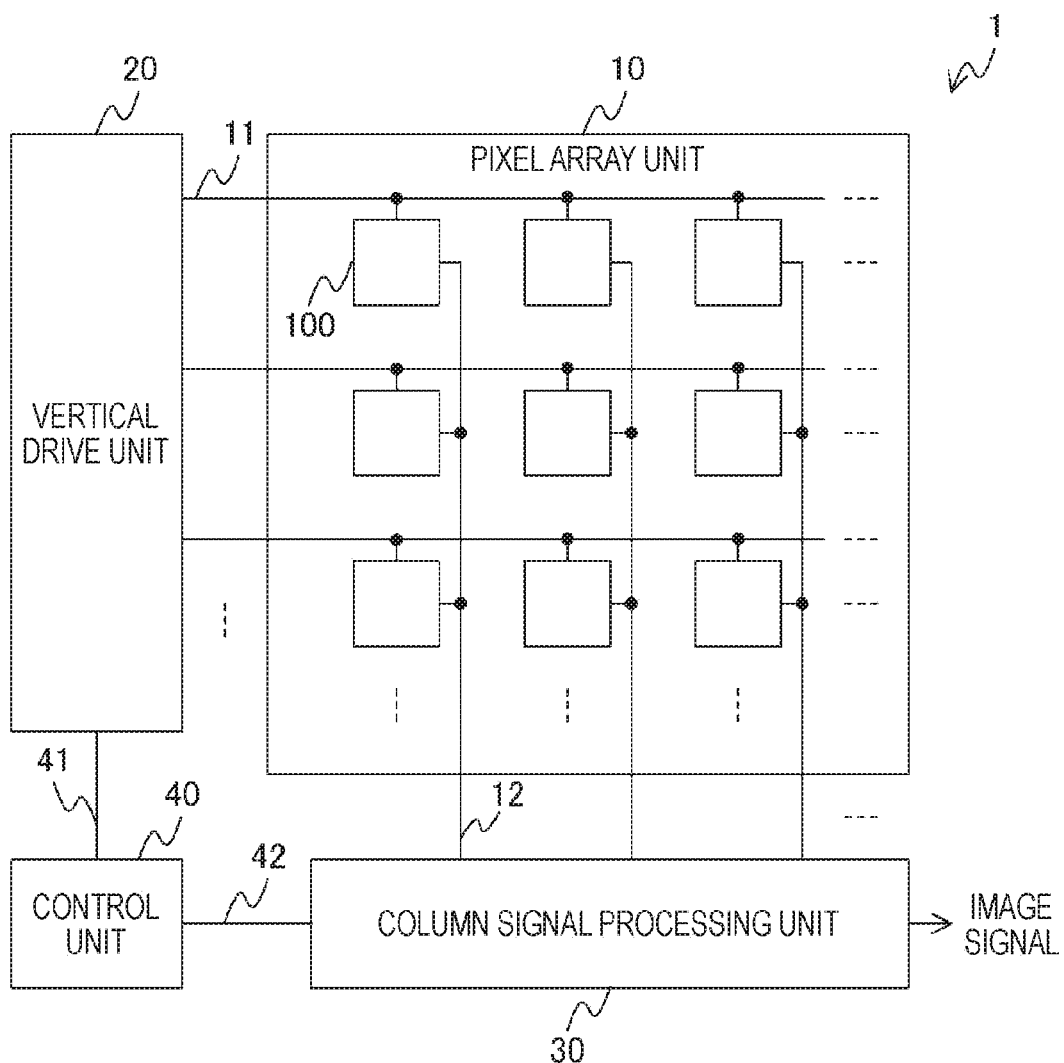
FIG. 1 is a diagram illustrating a configuration example of an image sensor according to an embodiment of the present technology.

Next, modes for carrying out the present technology (hereinafter, referred to as embodiments) will be described with reference to the drawings. In the drawings below, the same or resembling parts are denoted by the same or resembling reference numerals. However, the drawings are schematic, and the dimensional ratios and the like of respective units do not always match actual ones. Furthermore, it is needless to say that the drawings each include parts having dimensional relationships and ratios different between the respective drawings. In addition, the embodiments will be described in the following order.

1. First Embodiment
2. Second Embodiment
3. Third Embodiment
4. Fourth Embodiment
5. Fifth Embodiment
6. Application Example to Camera 1. First Embodiment

[Configuration of Image Sensor]

FIG. 1 is a diagram illustrating a configuration example of an image sensor according to an embodiment of the present technology. The image sensor 1 in FIG. 1 includes a pixel array unit 10, a vertical drive unit 20, a column signal processing unit 30, and a control unit 40.

The pixel array unit 10 is configured in such a manner that pixels 100 are arranged in a two-dimensional lattice. Here, the pixel 100 generates an image signal according to irradiation light. This pixel 100 includes a photoelectric conversion unit that generates a charge according to irradiation light. Furthermore, the pixel 100 further includes a pixel circuit. This pixel circuit generates an image signal based on the charge generated by the photoelectric conversion unit. The generation of the image signal is controlled by a control signal generated by the vertical drive unit 20 described later. In the pixel array unit 10, signal lines 11 and 12 are arranged in an XY matrix. The signal line 11 is a signal line that transports the control signal for the pixel circuit in the pixel 100, and is arranged for each row of the pixel array unit 10 so as to be commonly wired to the pixels 100 arranged in each row. The signal line 12 is a signal line that transports the image signal generated by the pixel circuit of the pixel 100, and is arranged for each column of the pixel array unit 10 so as to be commonly wired to the pixels 100 arranged in each column. These photoelectric conversion unit and pixel circuit are formed in a semiconductor substrate.

The vertical drive unit 20 generates the control signal for the pixel circuit of the pixel 100. This vertical drive unit 20 transports the generated control signal to the pixel 100 via the signal line 11 in FIG. 1. The column signal processing unit 30 processes the image signal generated by the pixel 100. This column signal processing unit 30 processes the image signal transported from the pixel 100 via the signal line 12 in FIG. 1. The process in the column signal processing unit 30 corresponds to, for example, analog-to-digital conversion that converts an analog image signal generated in the pixel 100 into a digital image signal. The image signal processed by the column signal processing unit 30 is output as an image signal of the image sensor 1. The control unit 40 controls the entire image sensor 1. This control unit 40 controls the image sensor 1 by generating and outputting control signals that control the vertical drive unit 20 and the column signal processing unit 30. The control signals generated by the control unit 40 are transported to the vertical drive unit 20 and the column signal processing unit 30 through signal lines 41 and 42, respectively. Note that the column signal processing unit 30 is an example of a processing circuit described in the claims. The image sensor 1 is an example of an imaging device described in the claims.

[Circuit Configuration of Pixel]

Figure 2:
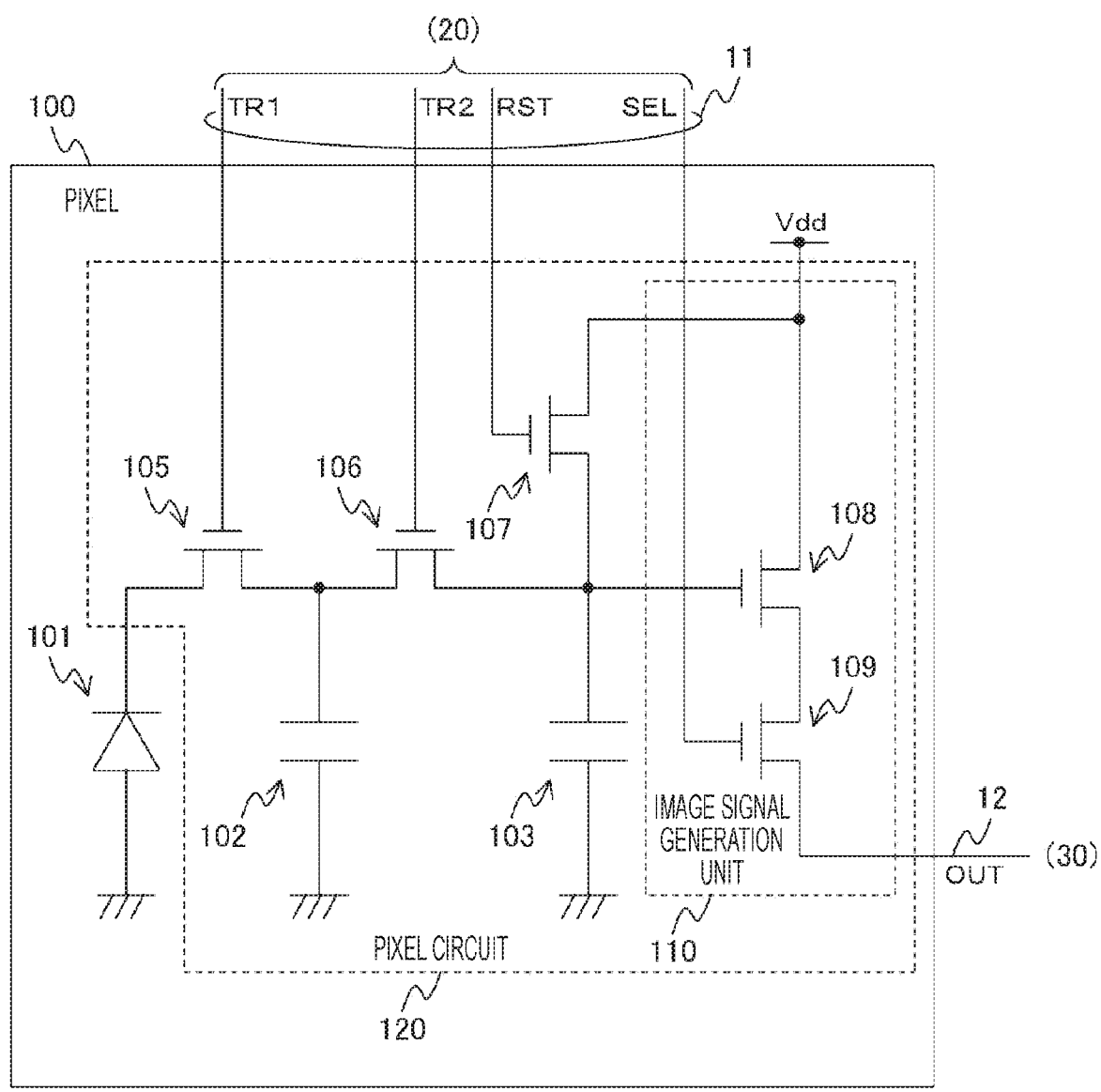
FIG. 2 is a diagram illustrating a circuit configuration example of a pixel according to a first embodiment of the present technology.

FIG. 2 is a diagram illustrating a circuit configuration example of a pixel according to a first embodiment of the present technology. FIG. 2 is a circuit diagram representing the configuration of the pixel 100. The pixel 100 in FIG. 2 includes a photoelectric conversion unit 101, a first charge holding unit 102, a second charge holding unit 103, and metal-oxide-semiconductor (MOS) transistors 105 to 109. Furthermore, signal lines TR1, TR2, RST, SEL, and OUT are wired in the pixel 100. The signal lines TR1, TR2, RST, and SEL are signal lines that transport the control signals for the pixel 100. These signal lines are connected to gates of the MOS transistors. When a voltage equal to or higher than a threshold value between the gate and the source is applied to the MOS transistors via these signal lines, the applied MOS transistors can be turned on. The signal lines TR1, TR2, RST, and SEL constitute the signal line 11. Meanwhile, the signal line OUT constitutes the signal line 12, and transports the image signal generated by the pixel 100. In addition, a power supply line Vdd is wired to the pixel 100, and power is supplied to the pixel 100.

An anode of the photoelectric conversion unit 101 is grounded, and a cathode thereof is connected to a source of the MOS transistor 105. A drain of the MOS transistor 105 is connected to a source of the MOS transistor 106 and one end of the first charge holding unit 102. Another end of the first charge holding unit 102 is grounded. The gate of the MOS transistor 105 is connected to the signal line TR1, and the gate of MOS transistor 106 is connected to the signal line TR2. A drain of the MOS transistor 106 is connected to a source of the MOS transistor 107, the gate of the MOS transistor 108, and one end of the second charge holding unit 103. Another end of the second charge holding unit 103 is grounded. The gate of the MOS transistor 107 is connected to the signal line RST. Drains of the MOS transistors 107 and 108 are commonly connected to the power supply line Vdd, and a source of the MOS transistor 108 is connected to a drain of the MOS transistor 109. A source of the MOS transistor 109 is connected to the signal line OUT, and the gate thereof is connected to the signal line SEL.

The photoelectric conversion unit 101 generates and holds a charge according to irradiation light as described earlier. A photodiode can be used for this photoelectric conversion unit 101. The MOS transistor 105 is a transistor that transfers a charge generated by the photoelectric conversion of the photoelectric conversion unit 101 to the first charge holding unit 102. The transfer of the charge in the MOS transistor 105 is controlled by a signal transported through the signal line TR1. The first charge holding unit 102 is a capacitor that holds a charge transferred by the MOS transistor 105. The MOS transistor 106 is a transistor that transfers a charge held in the first charge holding unit 102 to the second charge holding unit 103. The transfer of the charge in the MOS transistor 106 is controlled by a signal transported through the signal line TR2. Note that a floating diffusion formed in a diffusion layer of a semiconductor substrate can be used for the second charge holding unit 103.

The MOS transistor 108 is a transistor that generates a signal based on a charge held in the second charge holding unit 103. The MOS transistor 109 is a transistor that outputs a signal generated by the MOS transistor 108 to the signal line OUT as an image signal. This MOS transistor 108 is controlled by a signal transported through the signal line SEL. Furthermore, the MOS transistors 108 and 109 constitute an image signal generation unit 110.

The MOS transistor 107 is a transistor that resets the second charge holding unit 103 by discharging the charge held in the second charge holding unit 103 to the power supply line Vdd. This reset by the MOS transistor 107 is controlled by a signal transported through the signal line RST. At the time of this reset, by turning on the MOS transistors 105 and 106, the photoelectric conversion unit 101 and the first charge holding unit 102 can be simultaneously reset. Note that the first charge holding unit 102, the second charge holding unit 103, and the MOS transistors 105 to 109 constitute a pixel circuit 120. In addition, the first charge holding unit 102 and the second charge holding unit 103 are examples of a charge holding unit described in the claims.

An image signal can be generated in the pixel 100 in FIG. 2 as follows. First, the MOS transistors 105 to 107 are turned on to reset the photoelectric conversion unit 101. Next, after a predetermined time has elapsed, the MOS transistors 106 and 107 are turned on to reset the first charge holding unit 102. After this reset is completed, the MOS transistor 105 is turned on. As a result, a charge generated in the photoelectric conversion unit 101 is transferred to and held in the first charge holding unit 102. This operation from the reset of the photoelectric conversion unit 101 to the transfer of the charge by the MOS transistor 105 is performed simultaneously in all the pixels 100 arranged in the pixel array unit 10. With this configuration, a global shutter is implemented. Note that a period from the reset of the photoelectric conversion unit 101 to the transfer of the charge by the MOS transistor 105 corresponds to an exposure period.

Next, the MOS transistor 107 is turned on to reset the second charge holding unit 103. Next, the MOS transistor 106 is turned on to transfer the charge held in the first charge holding unit 102 to the second charge holding unit 103 and cause the second charge holding unit 103 to hold the transferred charge. Subsequent to this, the MOS transistor 108 generates an image signal according to the charge held in the second charge holding unit 103. Next, by turning on the MOS transistor 109, the image signal generated by the MOS transistor 108 is output to the signal line OUT. This operation from the reset of the second charge holding unit 103 to the output of the image signal is sequentially performed for each group of pixels 100 arranged in a row of the pixel array unit 10. By outputting the image signals of the pixels 100 in all rows of the pixel array unit 10, a frame containing image signals making up one screen can be generated.

By simultaneously exposing all the pixels 100 of the pixel array unit 10 in this manner, the occurrence of frame distortion can be blocked, and the image quality can be improved. As described above, the first charge holding unit 102 is used to temporarily hold the charge generated by the photoelectric conversion unit 101 when imaging using the global shutter technique is performed. Furthermore, since the second charge holding unit 103 is reset to transfer the charge from the first charge holding unit 102 to the second charge holding unit 103 immediately before the image signal is generated by the MOS transistors 108 and 109 and output from the pixel 100, an error due to the current (dark current) flowing into the second charge holding unit 103 can be decreased.

[Configuration of Image Sensor]

Figure 3:
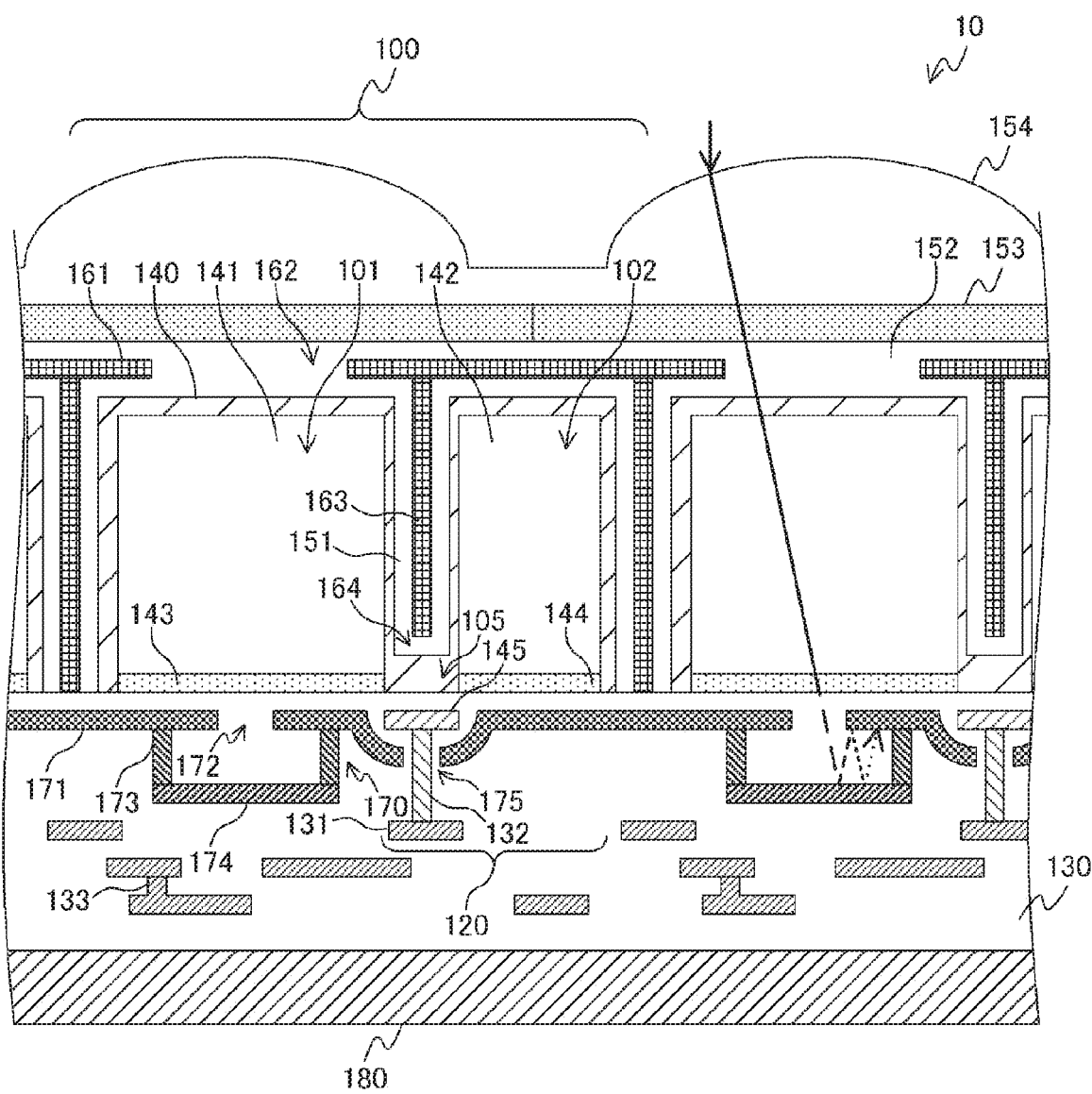
FIG. 3 is a diagram illustrating a configuration example of the pixel according to the first embodiment of the present technology.

FIG. 3 is a diagram illustrating a configuration example of the pixel according to the first embodiment of the present technology. FIG. 3 is a cross-sectional view representing a configuration example of the pixel 100. The pixel 100 includes a support substrate 180, a wiring region made up of an insulating layer 130 and a wiring layer 131, a semiconductor substrate 140, an insulating film 152, a color filter 153, and an on-chip lens 154. Note that the image sensor 1 in FIG. 3 corresponds to a back-side illuminated image sensor in which irradiation is conducted with incident light from a back surface side of the semiconductor substrate 140 (a surface different from a surface on which the wiring region is formed).

The semiconductor substrate 140 is a substrate made with semiconductor, on which the photoelectric conversion unit and a semiconductor part of the pixel circuit of the pixel 100 described with reference to FIG. 1 are formed. Furthermore, semiconductor parts of the vertical drive unit 20, the column signal processing unit 30, and the control unit 40 are further formed on the semiconductor substrate 140. A well region of p-type is formed on the semiconductor substrate 140, and the photoelectric conversion unit and the like of the pixel 100 are formed in this well region. For convenience, it is assumed that semiconductor substrate 140 constitutes the well region. FIG. 3 describes the photoelectric conversion unit 101, the first charge holding unit 102, and the MOS transistor 105.

The photoelectric conversion unit 101 is constituted by an n-type semiconductor region 141 and a surrounding p-type well region. Photoelectric conversion is performed by a pn junction at the interface between these n-type semiconductor region 141 and p-type well region. An electron out of a charge generated by this photoelectric conversion is held in the n-type semiconductor region 141. This held electron is transferred to the first charge holding unit 102 by the MOS transistor 105 described with reference to FIG. 2. Note that a p-type semiconductor region 143 is arranged on a front surface of the n-type semiconductor region 141. This p-type semiconductor region is a region for pinning the surface order of the semiconductor substrate 140. The second charge holding unit 102 is constituted by an n-type semiconductor region 142. A p-type semiconductor region 144 for pinning is also formed on the front surface of the n-type semiconductor region 142. The MOS transistor 105 is a MOS transistor in which the n-type semiconductor regions 141 and 142 are employed as source and drain regions, respectively, and the p-type well region between the n-type semiconductor regions 141 and 142 is employed as a channel region. Furthermore, in this MOS transistor 105, a gate 145 is arranged by interposing an insulating film.

An isolation region 151 is arranged between the photoelectric conversion unit 101 and the first charge holding unit 102. Specifically, the isolation region 151 is formed in the semiconductor substrate 140 between the n-type semiconductor regions 141 and 142. This isolation region is constituted by, for example, an insulator, and prevents the movement of a charge between the photoelectric conversion unit 101 and the charge holding unit 102. Note that the isolation region 151 can also be arranged between the pixels 100.

A light-shielding wall 163 can be arranged in the isolation region 151 around the photoelectric conversion unit 101. The light-shielding wall 163 blocks incident light for the pixel 100 and stray light to be described later from being incident onto the first charge holding unit 102. Furthermore, the light-shielding wall 163 further prevents stray light from being incident onto a pixel 100 in the adjacency. This light-shielding wall 163 can be constituted by, for example, a metal such as tungsten (W), aluminum (Al), and copper (Cu).

The wiring region is a region where the wiring layer 131 and the insulating layer 130 are formed. The wiring layer 131 is wiring that transports the image signal generated in the pixel 100 and the control signal that controls the pixel circuit. The signal lines 11 and 12 described with reference to FIG. 1 are constituted by the wiring layer 131. This wiring layer 131 can be constituted by a metal such as copper (Cu). The insulating layer 130 insulates the wiring layer 131. This insulating layer 130 can be constituted by, for example, an oxide such as silicon oxide ($SiO_2$). The wiring layer 131 can be configured in multiple layers. FIG. 3 represents an example of a wiring layer having a three-layer configuration. The wiring layers 131 arranged in different layers can be connected by a via plug 133. Furthermore, an element formed on the semiconductor substrate 140 and the wiring layer 131 can be connected by a contact plug. In FIG. 3, the gate 145 of the MOS transistor 105 is connected to the wiring layer 131 by a contact plug 132. Note that the wiring layer 131, the contact plug 132, and the via plug 133 are examples of a wiring layer described in the claims.

The on-chip lens 154 is a lens that collects light from a subject. The color filter 153 is an optical filter that transmits light of a predetermined wavelength out of light collected by the on-chip lens 154. For example, a color filter 153 that transmits any of red light, green light, and blue light can be used for this color filter 153. The insulating film 152 is a film that insulates the semiconductor substrate 140. An oxide film such as $SiO_2$ can be used for this insulating film 152. The support substrate 180 is a substrate that supports the semiconductor substrate 140 and the like during the manufacturing step of the image sensor 1. A silicon wafer can be used for this support substrate 180.

A light-shielding film 161 can be arranged in the insulating film 152. This light-shielding film 161 is a film that blocks light from being incident onto a region other than the photoelectric conversion unit 101 in the pixel 100. This light-shielding film 161 can be constituted by, for example, W, Al, and Cu. Note that an opening portion 162 is formed in a region of the light-shielding film 161 adjacent to the photoelectric conversion unit 101, such that incident light onto the photoelectric conversion unit 101 can be transmitted.

In the above-described pixel 100, light from a subject is incident onto the n-type semiconductor region 141 of the photoelectric conversion unit 101 via the on-chip lens 154 and the like. Part of this light is transmitted through the n-type semiconductor region 141 without contributing to photoelectric conversion. Such transmitted light is sometimes reflected by the wiring layer 131 and the like and is again incident onto the semiconductor substrate 140. Hereinafter, such light is referred to as stray light. This stray light becomes optical noise. For example, when stray light is incident onto the first charge holding unit 102 or the like, photoelectric conversion is caused due to the stray light, and a generated charge is added to a charge held in the first charge holding unit 102. For this reason, an error is produced in the image signal generated by the pixel 100, which becomes noise. In an image sensor of the global shutter technique, since the charge holding time in the first charge holding unit 102 is relatively long, the influence of stray light is larger, and the parasitic light sensitivity (PLS) is degraded. Furthermore, when stray light is incident onto a pixel 100 in the adjacency, crosstalk is produced. This is a phenomenon in which the image signal changes due to the incidence of light other than light from the subject, such as stray light, and is a cause of noise in the image signal.

In order to block this stray light from being incident onto the first charge holding unit 102, an incident light attenuation unit 170 is arranged in the pixel 100 in FIG. 3. This incident light attenuation unit 170 attenuates incident light transmitted through the photoelectric conversion unit 101, and is constituted by a lid portion 171, a wall portion 173, and a bottom portion 174. The lid portion 171, the wall portion 173, and the bottom portion 174 are all films that provide shielding from light, and for example, can be constituted by a metal or the like. Specifically, the lid portion 171 and the like can be constituted by metals such as Al, silver (Ag), gold (Au), Cu, platinum (Pt), molybdenum (Mo), chromium (Cr), titanium (Ti), nickel (Ni), W, and iron (Fe), semiconductors such as silicon (Si), germanium (Ge), and tellurium (Te), alloys thereof, and the like. Furthermore, a laminated structure of these metals and the like can be employed. In addition, the lid portion 171 and the like can have a configuration with a film thickness according to the light-shielding ability of the used material. For example, when W is used for the lid portion 171 and the like, the lid portion 171 and the like can be formed with a film thickness of 200 nm. At this time, a Ti film can also be arranged as a base of W. In this case, the Ti film is used as an adhesion layer.

The lid portion 171 has an opening portion 172 that is arranged adjacent to the photoelectric conversion unit 101 and transmits light transmitted through the photoelectric conversion unit 101. The wall portion 173 is arranged adjacent to the lid portion 171 and also is arranged so as to enclose the opening portion 172. The bottom portion 174 is arranged adjacent to the wall portion 173. In this manner, the incident light attenuation unit 170 is formed as a closed region except for the opening portion 172, by the lid portion 171, the wall portion 173, and the bottom portion 174. An insulator is arranged in this closed region. In FIG. 3, the insulating layer 130 is arranged in this region. Light that has been incident onto the incident light attenuation unit 170 via the opening portion 172 is attenuated while the reflection by the lid portion 171, the wall portion 173, and the bottom portion 174 is repeated. That is, light transmitted through the photoelectric conversion unit 101 is converted into heat energy in the incident light attenuation unit 170 and attenuated. The heavy-line arrows in FIG. 3 represent this state. Consequently, the generation of stray light can be prevented, and stray light can be blocked from being incident onto the first charge holding unit 102 and the like.

Note that the lid portion 171 in FIG. 3 is arranged between the semiconductor substrate 140 and the wiring region by interposing the insulating layer 130 to constitute the incident light attenuation unit 170. Furthermore, the lid portion 171 in FIG. 3 can be arranged so as to cover the entire area of the pixel 100. This prevents stray light from being incident onto the first charge holding unit 102 and the like. At this time, the above-described contact plug 132 is arranged in an opening portion 175 formed in the lid portion 171. By shrinking the size of this opening portion 175, the light-shielding property for the first charge holding unit 102 can be improved. Note that the configuration of the incident light attenuation unit 170 is not limited to this example. For example, the bottom portion 174 can be omitted such that part of the wiring 131 is used as a bottom portion.

[Configuration of Pixel]

Figure 4:
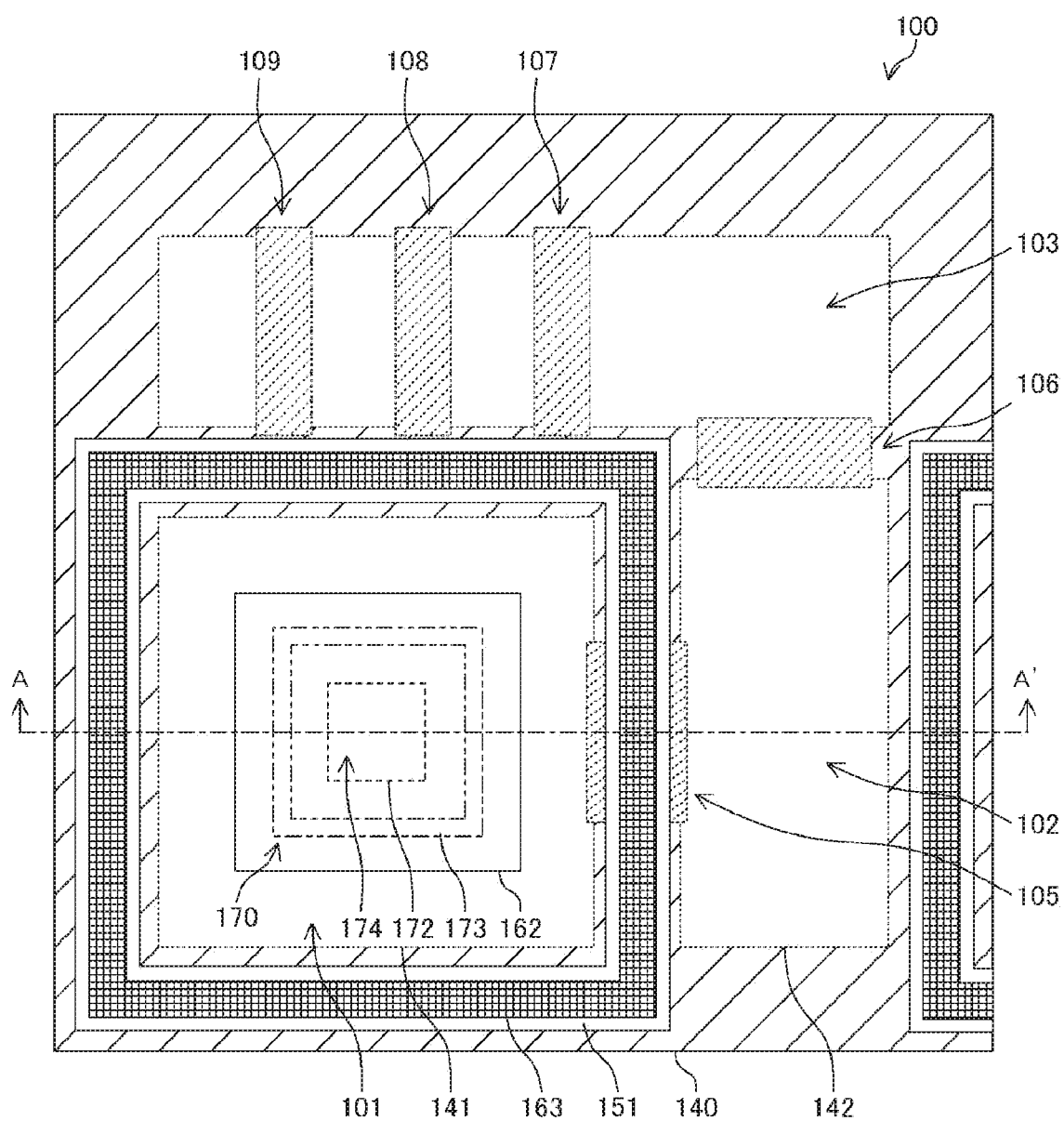
FIG. 4 is a diagram illustrating a configuration example of the pixel according to the first embodiment of the present technology.

FIG. 4 is a diagram illustrating a configuration example of the pixel according to the first embodiment of the present technology. FIG. 4 is a plan view representing the configuration of the pixel 100 as viewed from the back surface side, and is a diagram representing an example of the arrangement of the photoelectric conversion unit 101, the first charge holding unit 102, the second charge holding unit 103, and the MOS transistors 105 to 109 described with reference to FIG. 3. Note that FIG. 3 corresponds to a cross-sectional view taken along line A-A' in FIG. 4. In FIG. 4, the solid line rectangle represents the opening portion 162 of the light-shielding film 161, and the dotted line rectangle represents the opening portion 172 of the lid portion 171. The two-dot chain line represents the position of the wall portion 173. Among the dashed line rectangles, the regions hatched with diagonal lines represent the gates of the MOS transistors, and regions other than the hatched regions represent the n-type semiconductor regions formed in the semiconductor substrate 140.

The photoelectric conversion unit 101 is arranged at the lower left of the pixel 100. The gate and a drain region of the MOS transistor 105 are arranged in order adjacent to the right side of the photoelectric conversion unit 101. The gate and a drain region of the MOS transistor 106 are arranged in order adjacent to the drain region of the MOS transistor 105. Here, the drain region of the MOS transistor 105 corresponds to a source region of the MOS transistor 106 and also constitutes the first charge holding unit 102. The gate and a drain region of the MOS transistor 107 are arranged in order adjacent to the drain region of the MOS transistor 106. Here, the drain region of the MOS transistor 106 corresponds to a source region of the MOS transistor 107 and also constitutes the second charge holding unit 103.

The gate and a source region of the MOS transistor 108 are arranged in order adjacent to the drain region of the MOS transistor 107. Here, the drain region of the MOS transistor 107 corresponds to a drain region of the MOS transistor 108. The gate and a source region of the MOS transistor 109 are arranged in order adjacent to the source region of the MOS transistor 108. Here, the source region of the MOS transistor 108 corresponds to a drain region of the MOS transistor 109.

As represented in FIG. 4, the light-shielding wall 163 is arranged in the isolation region 151 around the n-type semiconductor region 141 of the photoelectric conversion unit 101. That is, the n-type semiconductor region 141 is enclosed by the light-shielding wall 163 and has a shape closed by the light-shielding film 161 as well as the lid portion 171, the wall portion 173, and the bottom portion 174. Furthermore, the opening portion 172 of the lid portion 171 is formed near a center portion of the n-type semiconductor region 141 of the photoelectric conversion unit 101. At this time, by arranging the on-chip lens 154 at a center portion of the n-type semiconductor region 141 at a position where incident light is collected, incident light transmitted through the photoelectric conversion unit 101 can be guided to the incident light attenuation unit 170. Then, this light transmitted through the photoelectric conversion unit 101 is sealed and attenuated by the incident light attenuation unit 170 having no exit other than the opening portion 172. Consequently, stray light can be prevented from being incident onto the first charge holding unit 102 and the second charge holding unit 103. In addition, the influence of stray light produced by a pixel 100 in the adjacency can also be removed. Note that the gates of the MOS transistors 105 to 109 in FIG. 4 are connected to a contact plug formed in an opening portion (not illustrated) formed in the lid portion 171.

[Method of Manufacturing Pixel]

Figure 5A:
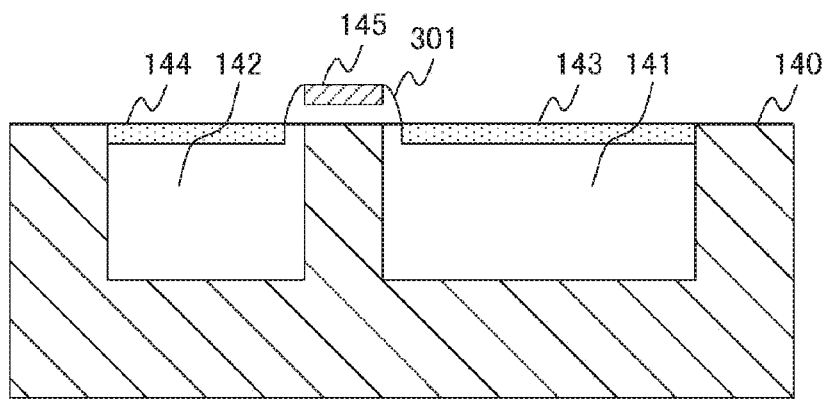
FIGS. 5A, 5B, and 5C are diagrams illustrating a method of manufacturing an image sensor according to the first embodiment of the present technology.
Figure 5B:
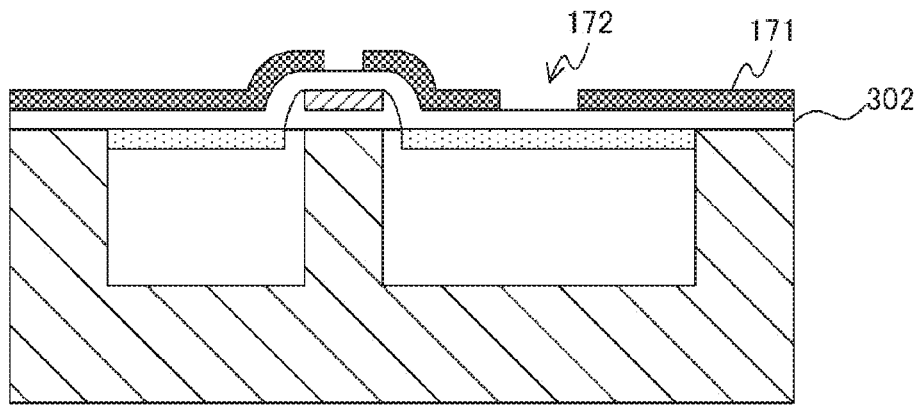
Figure 5C:
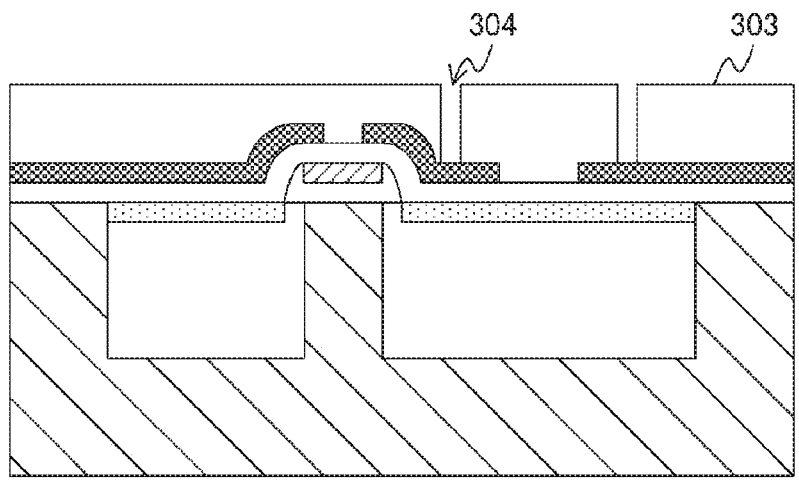

FIGS. 5A, 5B, 5C, 6A, 6B, 6C, 7A, 7B, 7C, 8A, 8B, 8C, 9A, 9B, 10A, and 10B are diagrams illustrating a method of manufacturing the image sensor according to the first embodiment of the present technology. First, the n-type semiconductor regions 141 and 142 are formed in the semiconductor substrate 140 by ion implantation. Next, after forming an insulating layer 301 as a gate oxide film, the gate 145 is formed. A sidewall-shaped insulating layer is formed on the gate 145, and the p-type semiconductor regions 143 and 144 are formed by ion implantation. (FIG. 5A). Next, an insulating layer 302 and the lid portion 171 are laminated in order. This lamination can be performed by chemical vapor deposition (CVD) or sputtering. Next, the opening portion 172 is formed in the lid portion 171 by, for example, dry etching (FIG. 5B). Next, an insulating layer 303 is formed, and a trench 304 is formed by, for example, dry etching (FIG. 5C).

Figure 6A:
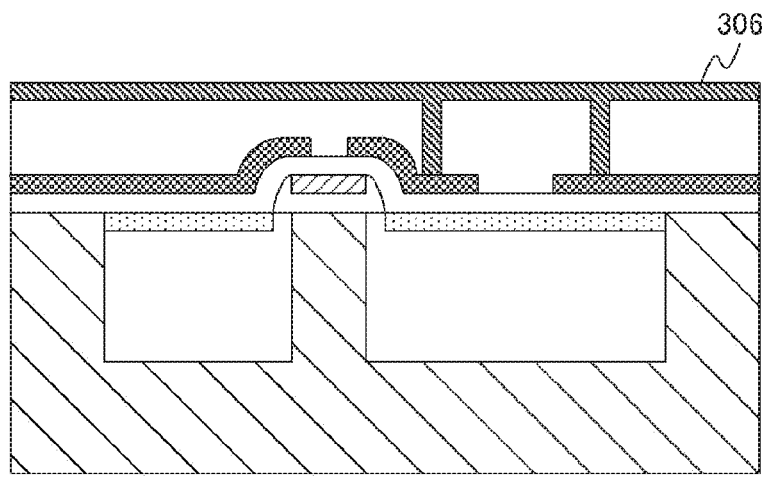
FIGS. 6A, 6B, and 6C are diagrams illustrating a method of manufacturing the image sensor according to the first embodiment of the present technology.
Figure 6B:
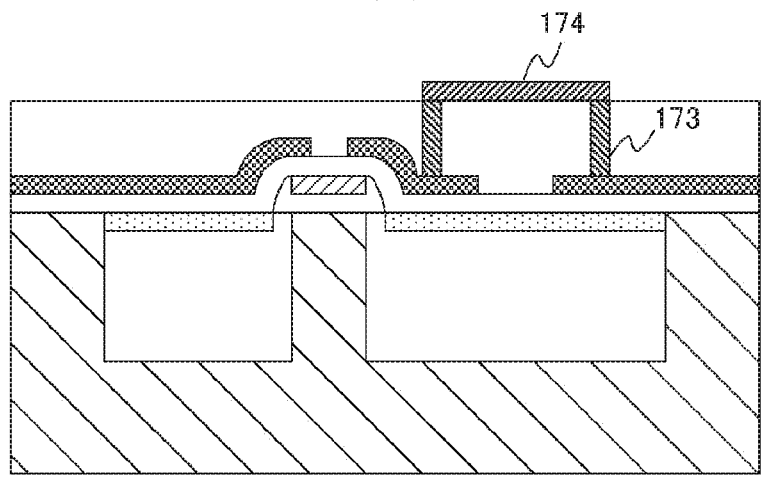
Figure 6C:
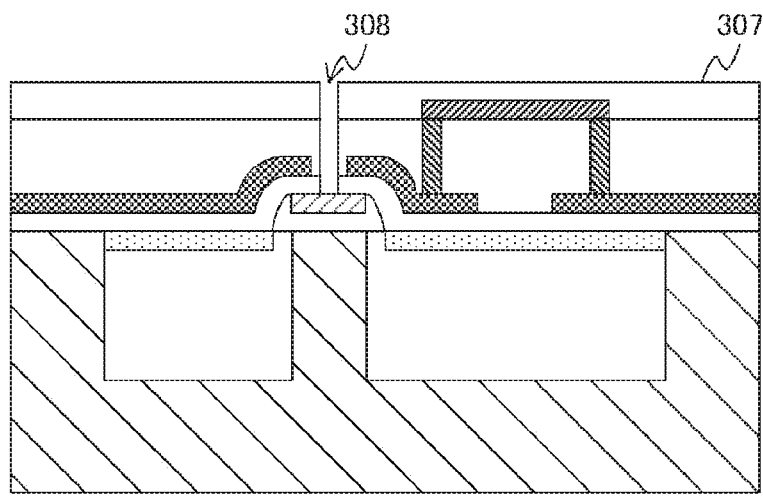
Figure 7A:
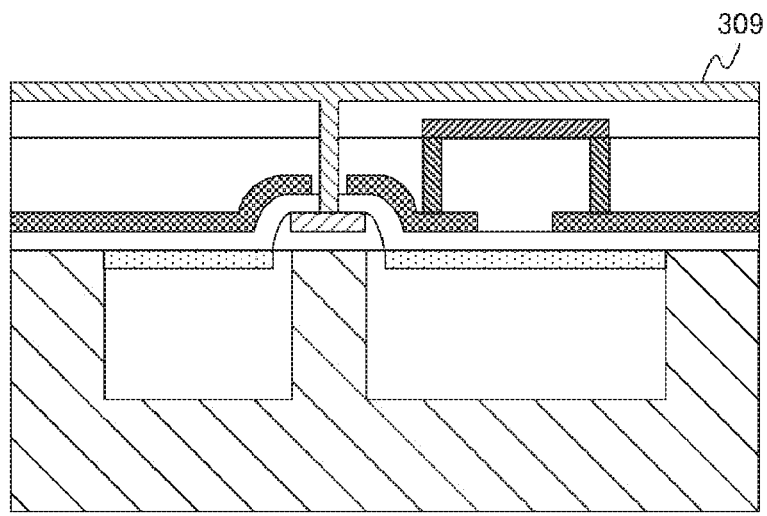
FIGS. 7A, 7B, and 7C are diagrams illustrating a method of manufacturing the image sensor according to the first embodiment of the present technology.
Figure 7B:
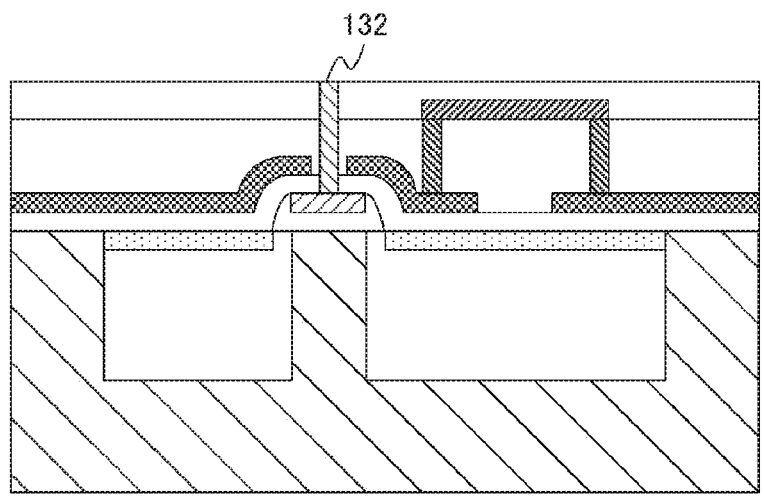
Figure 7C:
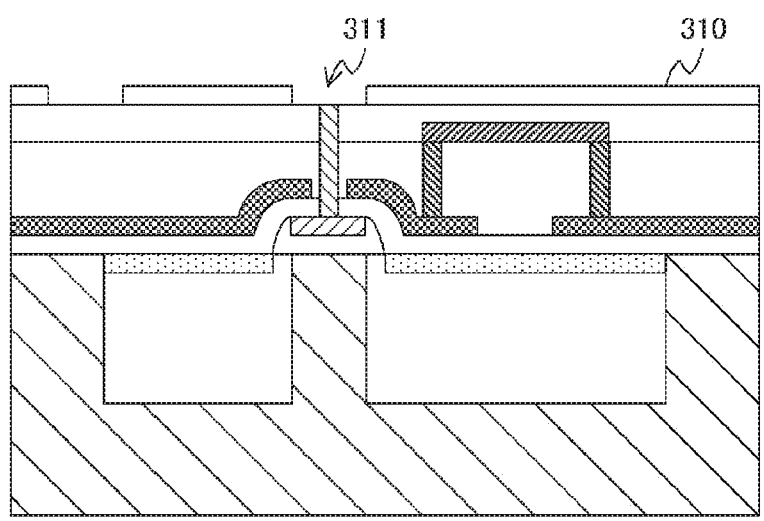

Next, a metal film 306 constituting the lid portion 171 is constructed. At this time, the metal film 306 is also arranged in the trench 304 of the insulating layer 303 (FIG. 6A). Next, the bottom portion 174 and the wall portion 173 are simultaneously formed by patterning the metal film 306 (FIG. 6B). Next, an insulating layer 307 is formed, and an opening portion 308 reaching the gate 145 is formed (FIG. 6C). Next, a metal film 309, which is a material of the contact plug 132, such as W, is constructed. At this time, the metal film 309 is arranged inside the opening portion 308 (FIG. 7A). Next, the metal film 309 on an outer surface is removed by, for example, chemical mechanical polishing (CMP) to form the contact plug 132 (FIG. 7B). Next, an insulating layer 310 is constructed as a film, and an opening portion 311 is formed at a position where the wiring layer 131 at the first layer is to be arranged (FIG. 7C).

Figure 8A:
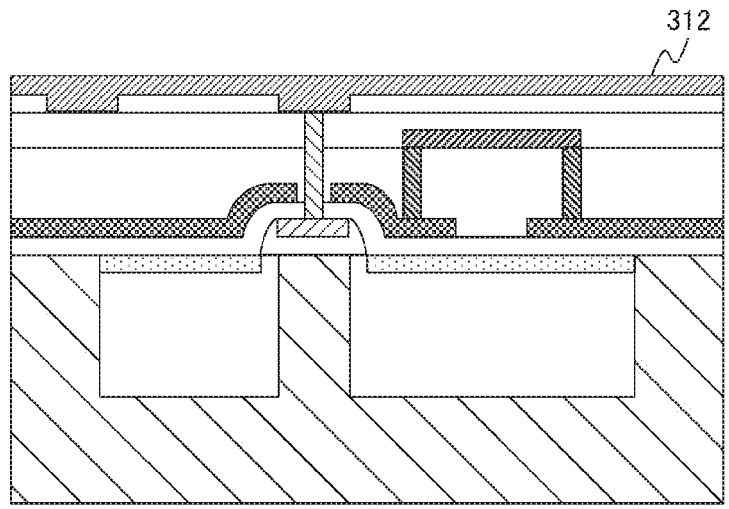
FIGS. 8A, 8B, and 8C are diagrams illustrating a method of manufacturing the image sensor according to the first embodiment of the present technology.
Figure 8B:
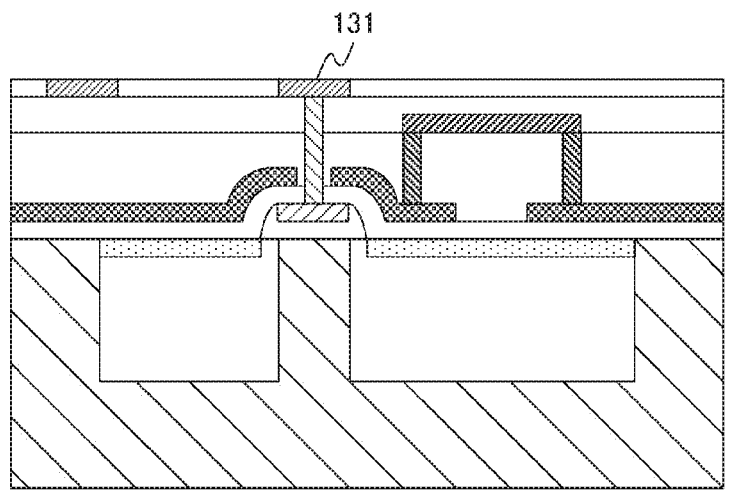
Figure 8C:
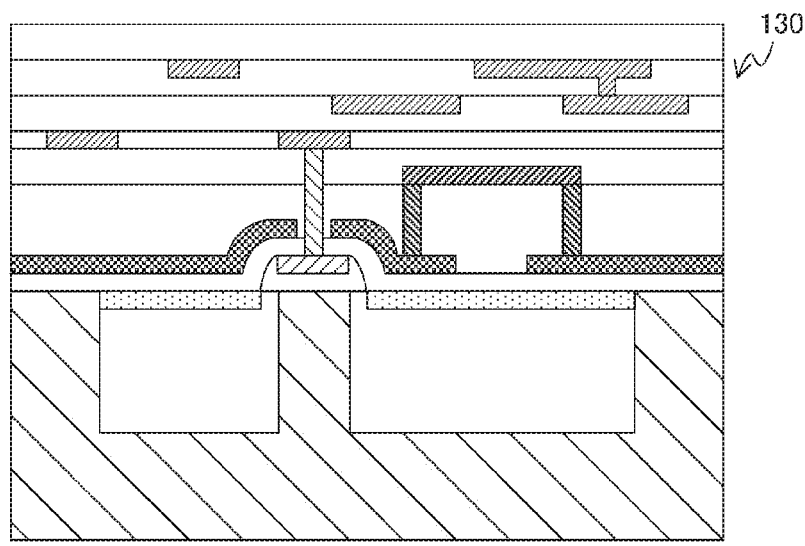
Figure 9A:
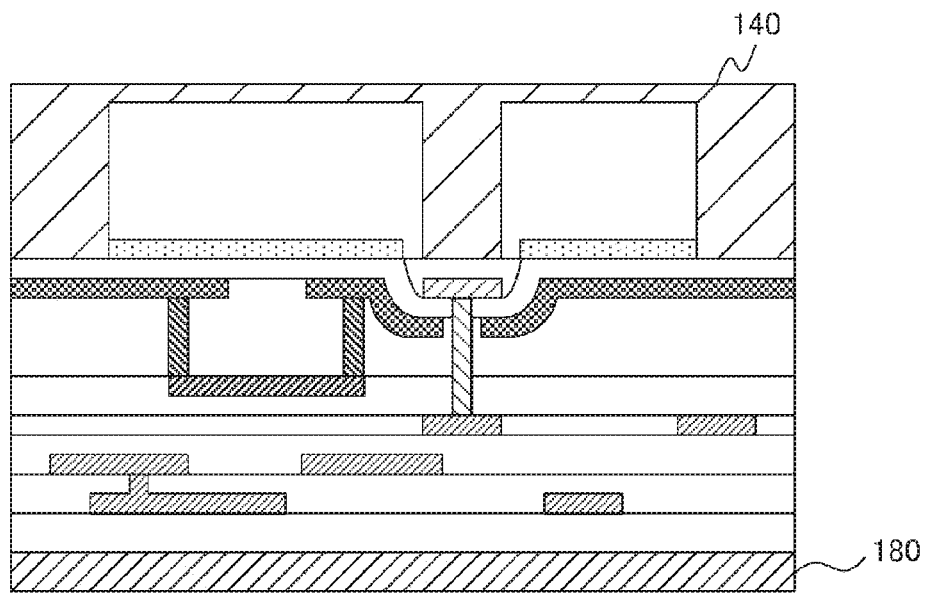
FIGS. 9A and 9B are diagrams illustrating a method of manufacturing the image sensor according to the first embodiment of the present technology.
Figure 9B:
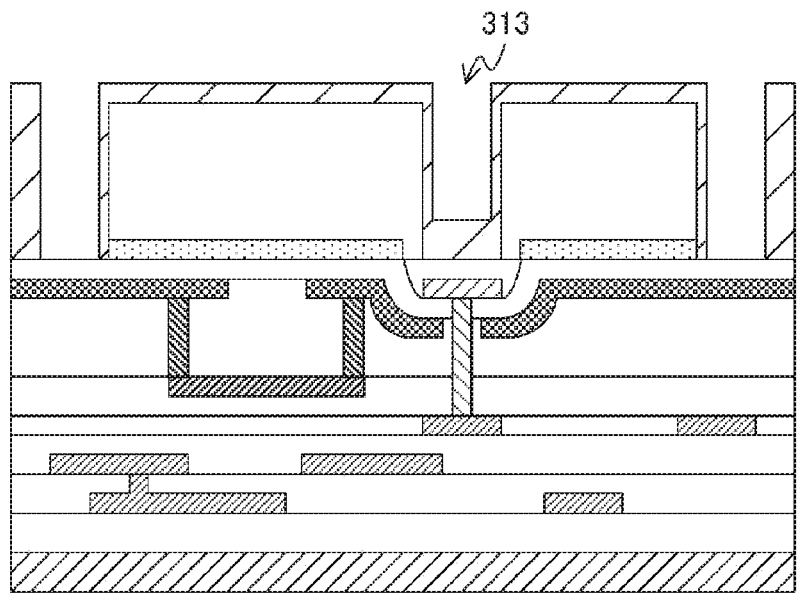
Figure 10A:
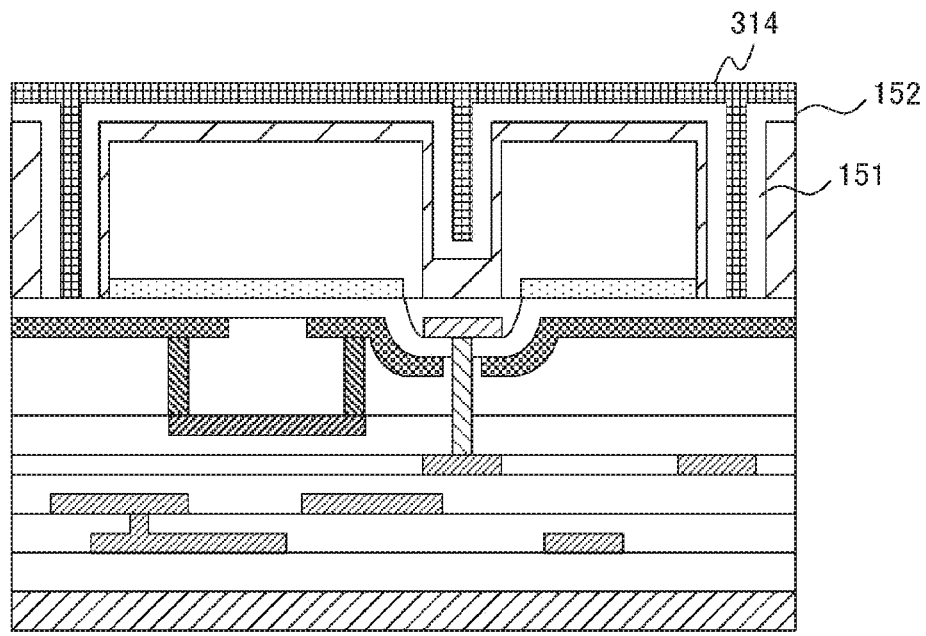
Figure 10B:
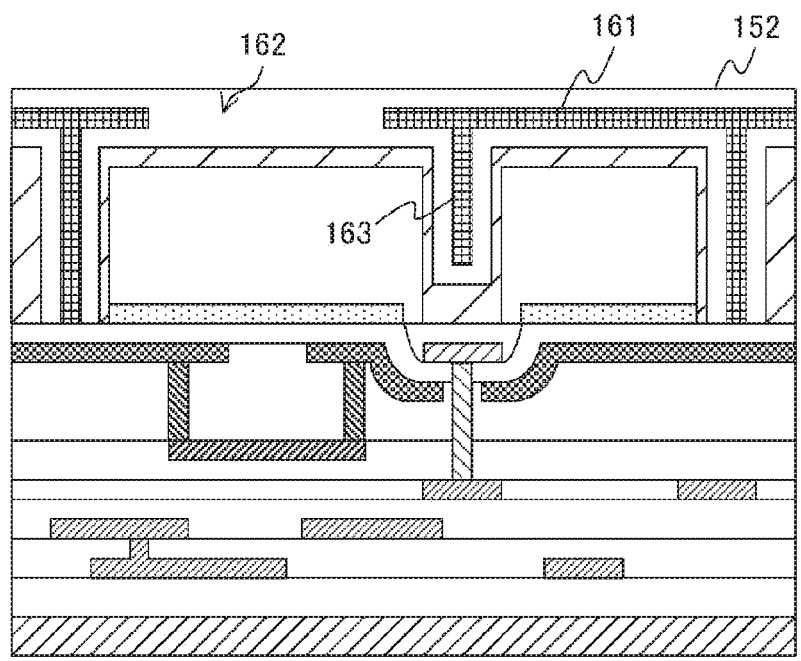

Next, a metal layer 312, which is to constitute the wiring layer 131, is constructed as a film. Cu or the like can be used for this metal layer 312, and the metal layer 312 can be formed by plating (FIG. 8A). Next, the metal layer 312 is ground by CMP to form the wiring layer 131 (FIG. 8B). Thereafter, the film construction for the insulating layer and the wiring layer is repeated to form a wiring region (FIG. 8C). Next, the support substrate 180 is bonded to an outer surface of the insulating layer 130, and the semiconductor substrate 140 is turned upside down such that the semiconductor substrate 140 is ground and thinned (FIG. 9A). Next, a trench 313 is formed in the semiconductor substrate 140 (FIG. 9B). Next, an insulating film is formed on side and bottom surfaces of the trench 313 to form the isolation region 151, and a metal film 314 is formed and embedded in the isolation region 151. At the same time, the insulating film 152 is formed on an outer surface of the semiconductor substrate 140 (FIG. 10A). Next, the opening portion 162 is formed by etching the metal film 314. As a result, the light-shielding film 161 and the light-shielding wall 163 can be formed simultaneously. Next, the insulating film 152 is further constructed (FIG. 10B). Thereafter, the color filter 153 and the on-chip lens 154 are formed, and then the image sensor 1 can be manufactured.

First Modification

Although the above-described image sensor 1 uses the lid portion 171 including the opening portion 172 having a rectangular shape, the shape of the opening portion 172 may be altered according to the intensity of incident light, or the like.

Figures 11A, 11B:
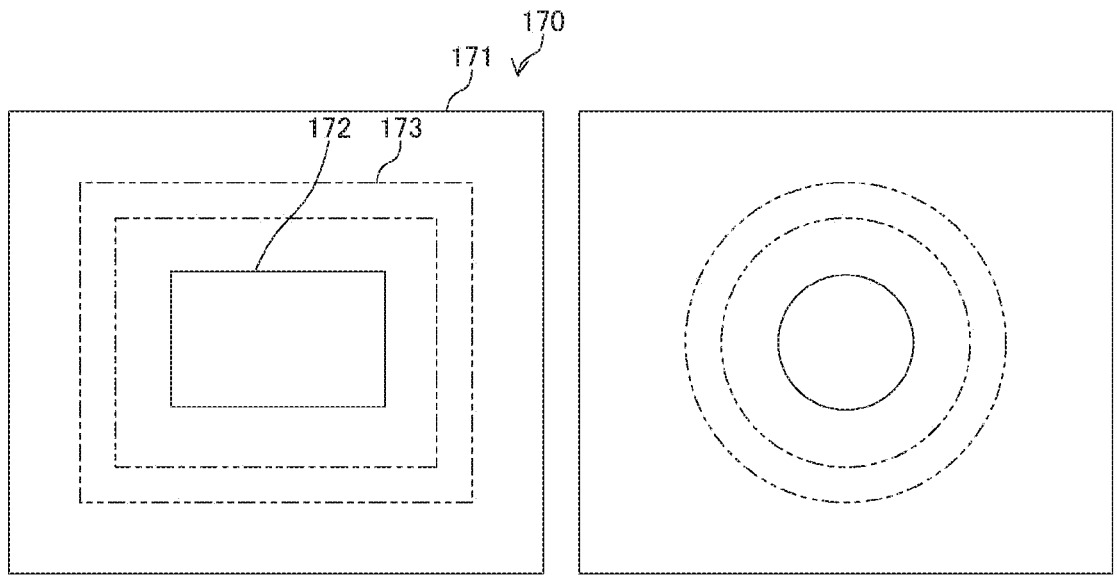
Figures 11C, 11D:
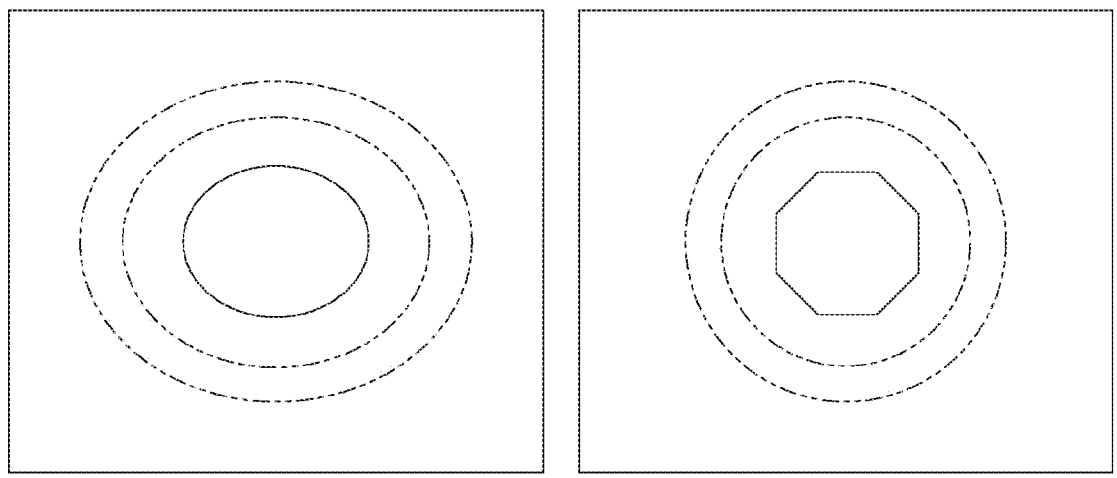

FIGS. 11A, 11B, 11C, and 11D are diagrams illustrating configuration examples of an incident light attenuation unit according to a first modification of the first embodiment of the present technology. In FIGS. 11A, 11B, 11C, and 11D, FIG. 11A depicts an example of a lid portion 171 including an opening portion 172 having an oblong rectangular shape. Similarly, the cross-sectional shape of the wall portion 173 can be shaped into an oblong rectangle. In FIGS. 11A, 11B, 11C, and 11D, FIGS. 11B and 11C represent examples of opening portions 172 having circular and elliptical shapes, respectively. Furthermore, FIG. 11D represents an example of an opening portion 172 having an octagonal shape.

Second Modification

Although the above-described image sensor 1 uses the lid portion 171 and the like formed by a light-shielding material, a film that prevents reflection may be arranged.

Figure 12:
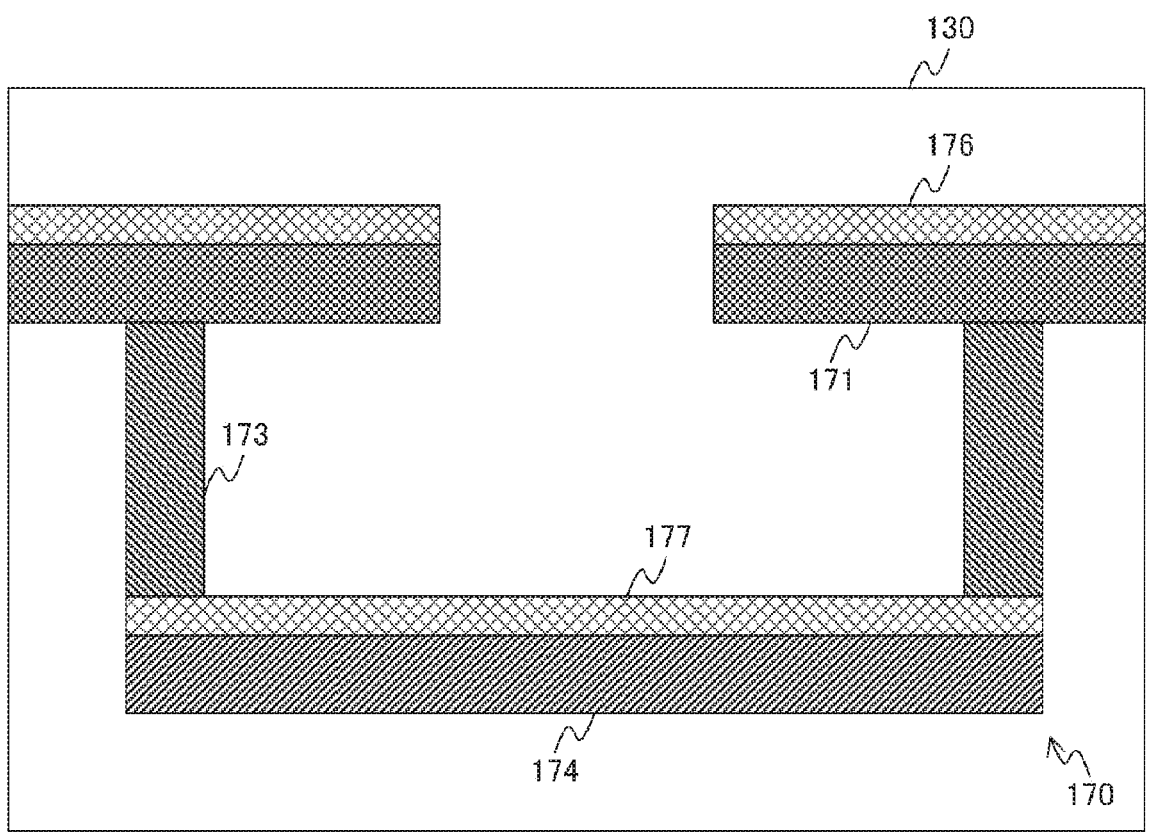
FIG. 12 is a diagram illustrating a configuration example of an incident light attenuation unit according to a second modification of the first embodiment of the present technology.

FIG. 12 is a diagram illustrating a configuration example of an incident light attenuation unit according to a second modification of the first embodiment of the present technology. The incident light attenuation unit 170 in FIG. 12 further includes antireflection films 176 and 177. The antireflection film 176 is laminated on the lid portion 171, and the antireflection film 177 is laminated on the bottom portion 174. For example, these antireflection films 176 and 177 can be constituted by Ti or the like. By laminating the antireflection films 176 and 177 to a thickness of one fourth of the assumed wavelength of transmitted light from the photoelectric conversion unit 101, light incident onto the antireflection film 176 and the like and light reflected from the lid portion 171 and the like cancel each other, and thus reflected light can be decreased. This antireflection film 176 and the like can have a configuration with a thickness of, for example, 60 nm.

As described above, since the image sensor 1 according to the first embodiment of the present technology includes the incident light attenuation unit 170 constituted by the lid portion 171 having the opening portion 172, the wall portion 173, and the bottom portion 174, incident light transmitted through the photoelectric conversion unit 101 can be attenuated. Consequently, stray light can be blocked from being incident onto the first charge holding unit 102 and the like, and noise in the image signal can be decreased. Furthermore, stray light can also be blocked from being incident onto a pixel 100 in the adjacency, and the occurrence of crosstalk can be prevented. As described above, the incidence of light transmitted through the photoelectric conversion unit 101 onto the charge holding unit, a pixel in the adjacency, and the like can be reduced, and deterioration in image quality can be prevented.

2. Second Embodiment

In the image sensor 1 according to the first embodiment described above, the wiring layer 131 is formed after the incident light attenuation unit 170 is formed in the wiring region. In contrast to this, an image sensor 1 according to a second embodiment of the present technology differs from the above-described first embodiment in that a wall portion and a bottom portion out of an incident light attenuation unit are formed simultaneously with a wiring layer.

[Method of Manufacturing Pixel]

Figure 13A:
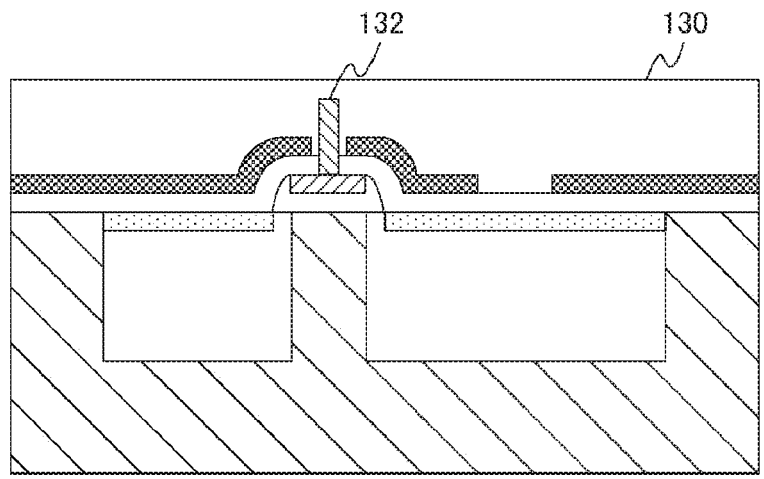
FIGS. 13A, 13B, and 13C are diagrams illustrating a method of manufacturing an image sensor according to a second embodiment of the present technology.
Figure 13B:
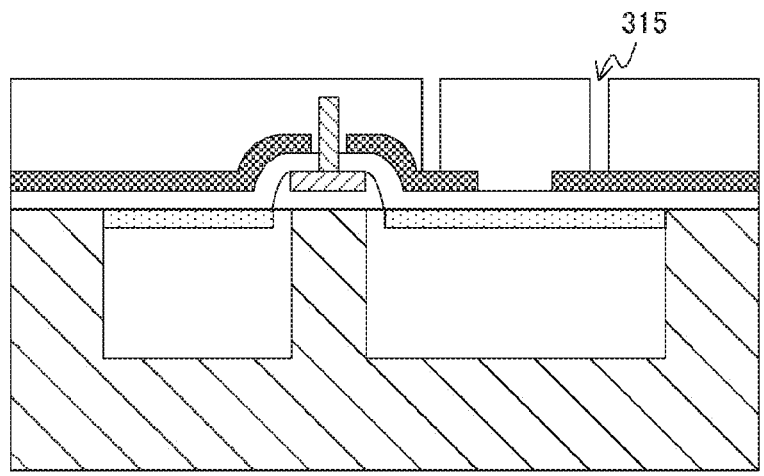
Figure 13C:
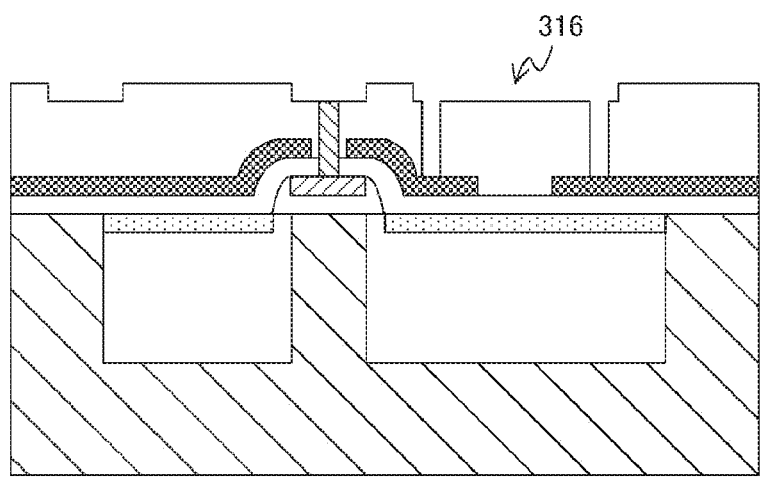
Figure 14A:
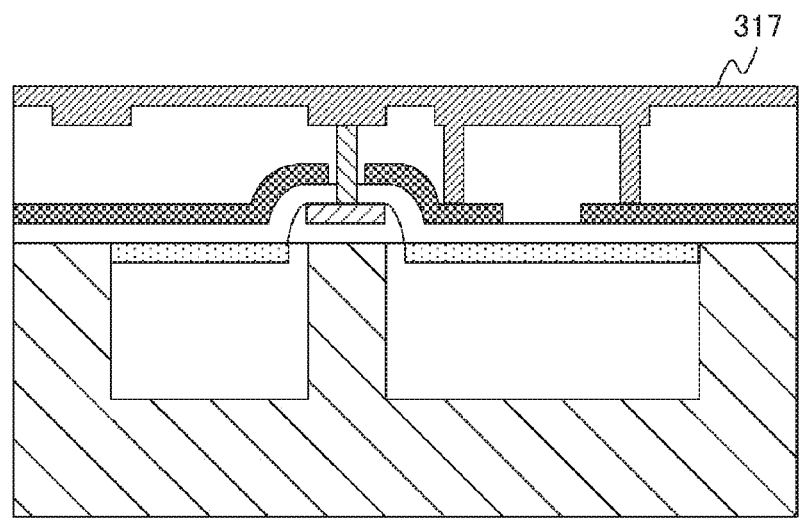
FIGS. 14A and 14B are diagrams illustrating a method of manufacturing the image sensor according to the second embodiment of the present technology.
Figure 14B:
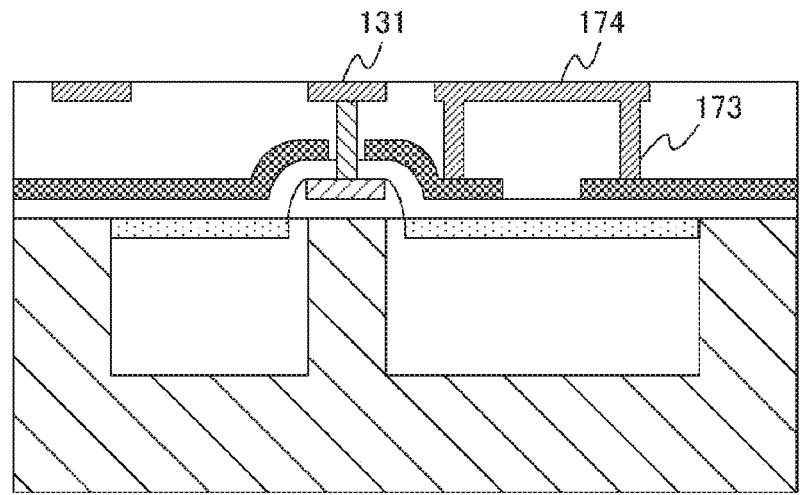

FIGS. 13A, 13B, 13C, 14A, and 14B are diagrams illustrating a method of manufacturing the image sensor according to the second embodiment of the present technology. As represented in a of FIGS. 13A, 13B, and 13C, a contact plug 132 is formed inside an insulating layer 130 (a FIG. 13A). Next, a trench 315 is formed in the insulating layer 130 (FIG. 13B). Next, an opening portion 316 is formed in a region where a wiring layer 131 and a bottom portion 174 are to be arranged (FIG. 13C). Next, a metal film 317 is formed by, for example, plating (FIG. 14A). Next, the metal film 317 is ground by, for example, CMP to form the wiring layer 131, a wall portion 173, and the bottom portion 174.

The configuration of the image sensor 1 other than the above-described configuration is similar to the configuration of the image sensor 1 described in the first embodiment of the present technology, and thus a description thereof will be omitted.

As described above, the image sensor 1 according to the second embodiment of the present technology can simplify the method of manufacturing the image sensor 1 by forming the wall portion 173 and the bottom portion 174 simultaneously with the wiring layer 131.

3. Third Embodiment

In the image sensor 1 according to the first embodiment described above, the wiring layer 131 is formed after the incident light attenuation unit 170 is formed in the wiring region. In contrast to this, an image sensor 1 according to a third embodiment of the present technology differs from the above-described first embodiment in that a wall portion out of an incident light attenuation unit 170 is formed simultaneously with a wiring layer.

[Method of Manufacturing Pixel]

Figure 15A:
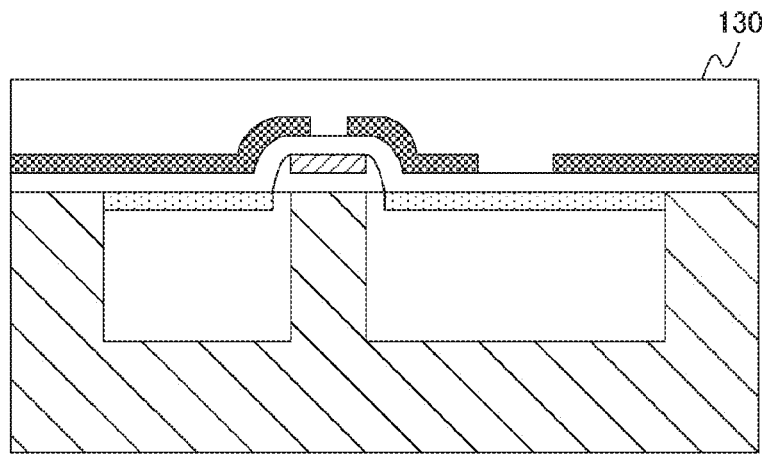
FIGS. 15A, 15B, and 15C are diagrams illustrating a method of manufacturing an image sensor according to a third embodiment of the present technology.
Figure 15B:
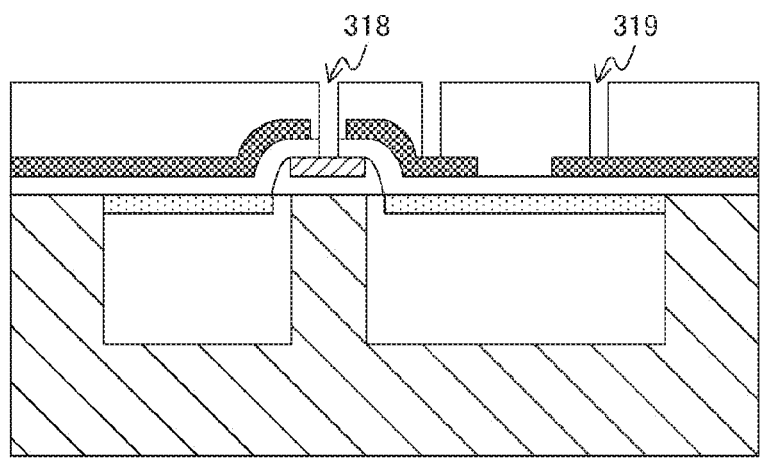
Figure 15C:
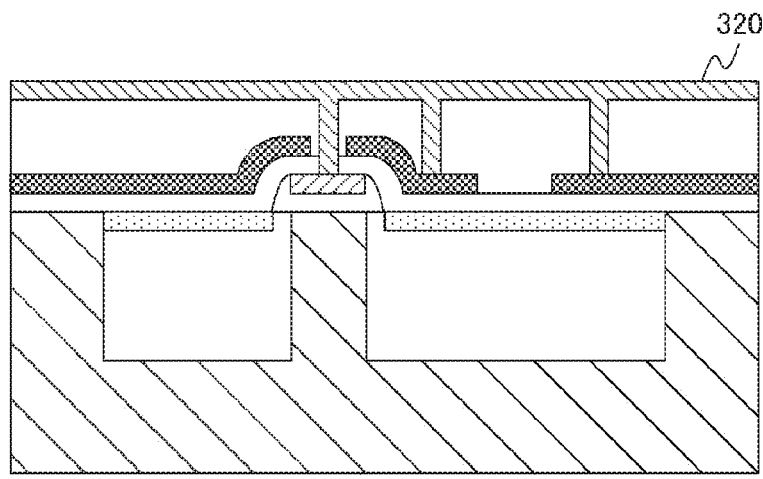
Figure 16A:
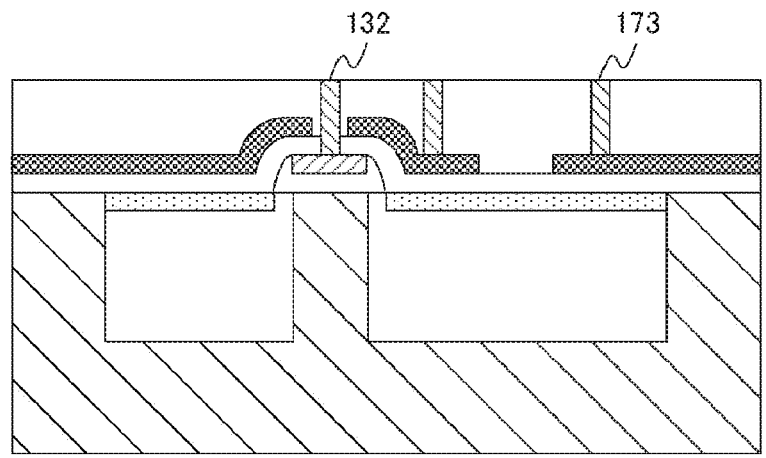
FIGS. 16A, 16B, and 16C are diagrams illustrating a method of manufacturing the image sensor according to the third embodiment of the present technology. splayed in an enlarged manner is moved on the basis of the drag operation.
Figure 16B:
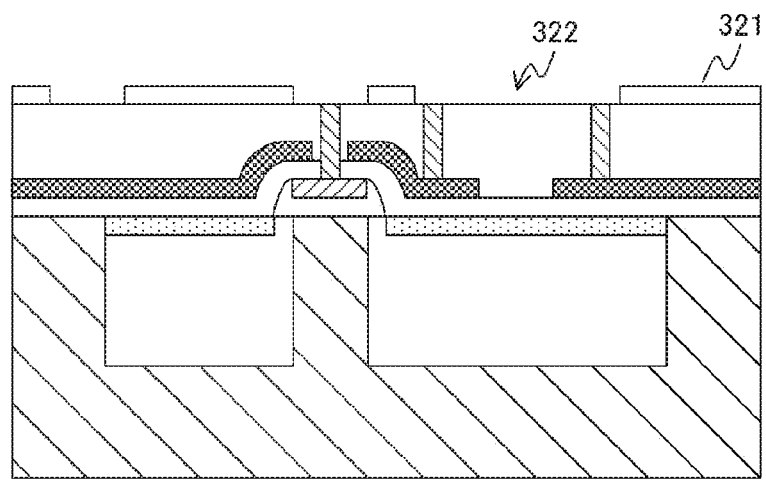
Figure 16C:
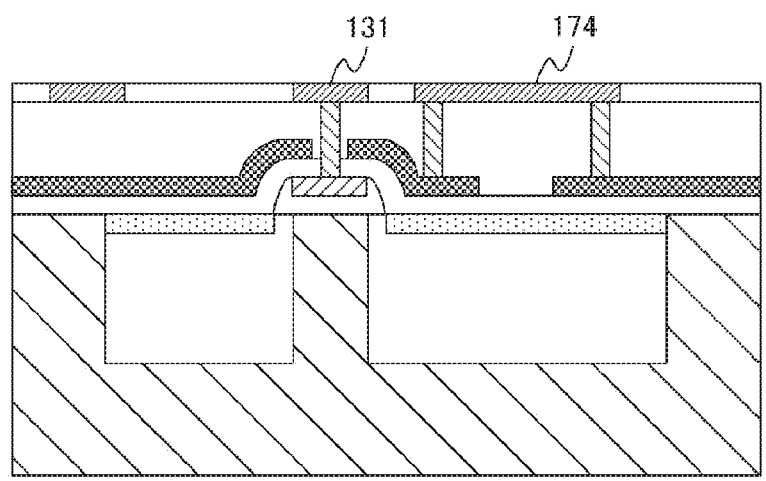

FIGS. 15A, 15B, 15C, 16A, 16B, and 16C are diagrams illustrating a method of manufacturing the image sensor according to the third embodiment of the present technology. As represented in FIG. 15A, an insulating layer 130 is arranged after forming a lid portion 171 (FIG. 15A). Next, an opening portion 318 and a trench 319 are formed at positions where a contact plug 132 and a wall portion 173 are to be arranged (FIG. 15B). Next, a metal film 320 is constructed by CVD or the like (FIG. 15C). Next, the metal film 320 is ground by CMP or the like to form the contact plug 132 and the wall portion 173 by (FIG. 16A). Next, an insulating layer 321 is constructed as a film, and an opening portion 322 is formed at a position where a wiring layer 131 and a bottom portion 174 are to be arranged (FIG. 16B). Next, the wiring layer 131 and the bottom portion 174 are formed. This formation can be performed by, for example, constructing a metal film by plating or the like and grinding the constructed metal film by CMP or the like (FIG. 16C). As described above, in the manufacturing method in FIGS. 15A, 15B, 15C, 16A, 16B, and 16C, the contact plug 132 and the wall portion 173 are formed simultaneously, and the wiring layer 131 and the bottom portion 174 are formed simultaneously.

The configuration of the image sensor 1 other than the above-described configuration is similar to the configuration of the image sensor 1 described in the first embodiment of the present technology, and thus a description thereof will be omitted.

As described above, the image sensor 1 according to the third embodiment of the present technology can simplify the method of manufacturing the image sensor 1 by forming the wall portion 173 simultaneously with the contact plug 132.

4. Fourth Embodiment

The image sensor 1 according to the first embodiment described above performs imaging of the global shutter type. In contrast to this, an image sensor 1 according to a fourth embodiment of the present technology differs from the above-described first embodiment in performing imaging of a rolling shutter type.

[Circuit Configuration of Pixel]

Figure 17:
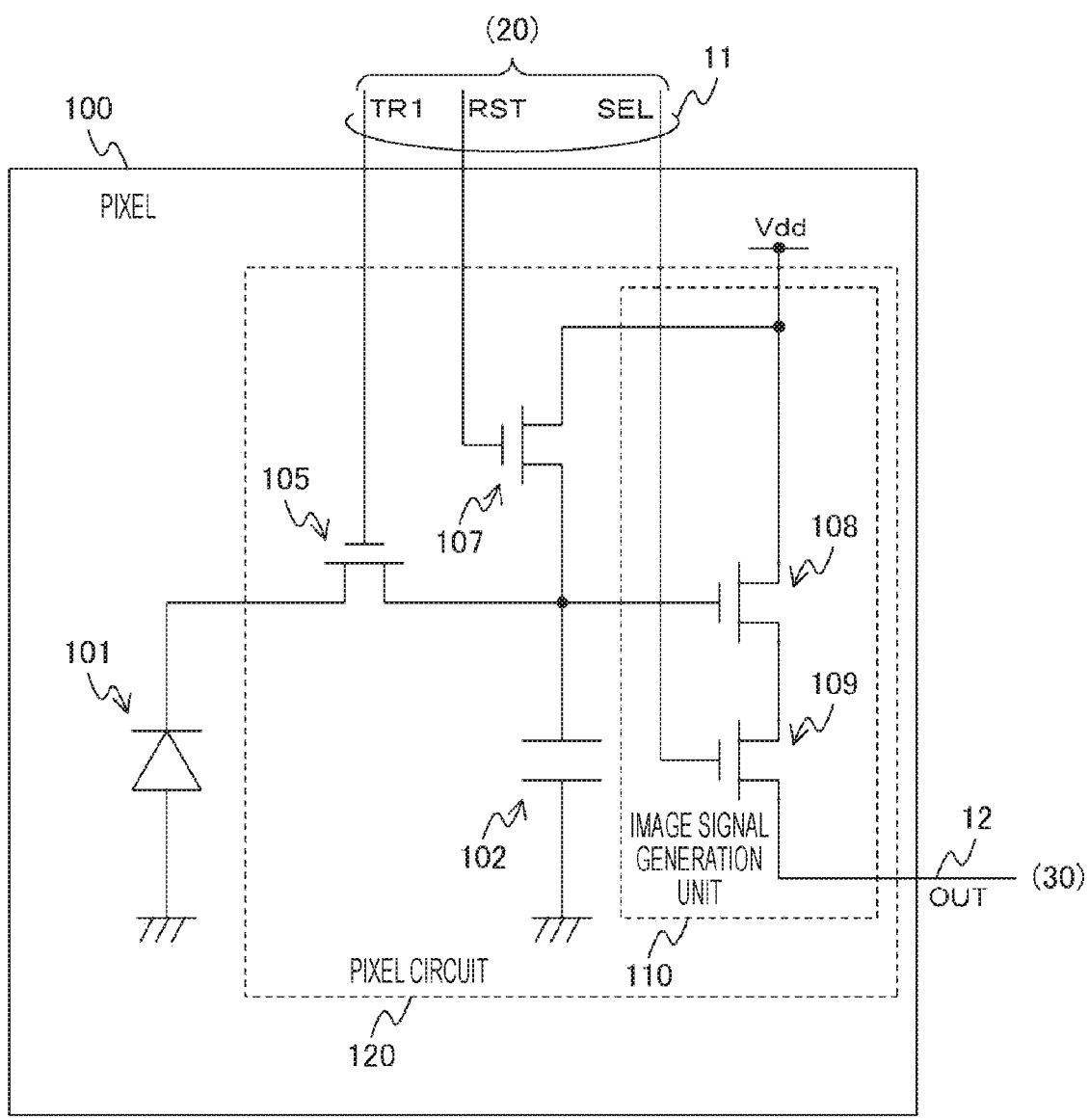
FIG. 17 is a diagram illustrating a circuit configuration example of a pixel according to a fourth embodiment of the present technology.

FIG. 17 is a diagram illustrating a circuit configuration example of a pixel according to the fourth embodiment of the present technology. FIG. 17 is a circuit diagram representing the configuration of the pixel 100, similarly to FIG. 2. The pixel 100 in FIG. 17 differs from the pixel 100 described with reference to FIG. 2 in that the MOS transistor 106 and the second charge holding unit 103 are omitted.

In FIG. 17, a drain of a MOS transistor 105 is connected to a source of a MOS transistor 107, a gate of a MOS transistor 108, and one end of a first charge holding unit 102. Furthermore, a pixel circuit 120 is constituted by the MOS transistors 105 and 107 to 109 and the first charge holding unit 102. The circuit configuration of the pixel 100 other than the above-described configuration is similar to the circuit configuration of the pixel 100 described with reference to FIG. 2, and thus a description thereof will be omitted.

Imaging can be performed by the pixel 100 in FIG. 17 as follows. First, the MOS transistors 105 and 107 are turned on to reset a photoelectric conversion unit 101. Next, after a predetermined exposure period has elapsed, the MOS transistor 107 is turned on to reset the first charge holding unit 102. After the reset of the first charge holding unit 102 is completed, the MOS transistor 105 is turned on to transfer a charge generated by the photoelectric conversion unit 101 to the first charge holding unit 102. Thereafter, an image signal is generated by the MOS transistor 108 on the basis of the charge transferred to and held in the first charge holding unit 102, and is output to a signal line OUT by the MOS transistor 109.

The exposure in the photoelectric conversion unit 101 and the output of the image signal after exposure described above are sequentially executed by varying the time for each group of pixels 100 arranged in a row of a pixel array unit 10, such that image signals making up one screen (frame) can be generated. Such imaging is called a rolling shutter type, and the configuration of the pixel 100 can be simplified by applying this imaging method. However, in this rolling shutter type imaging, since a variation is produced in the imaging time for each row, distortion is produced when a moving subject is imaged. Even in the case of the image sensor 1 of this rolling shutter type, when stray light is incident onto the first charge holding unit 102 during the generation of an image signal, noise is produced in the image signal. Thus, an incident light attenuation unit 170 is arranged to prevent stray light from being incident onto the first charge holding unit 102.

[Configuration of Pixel]

Figure 18:
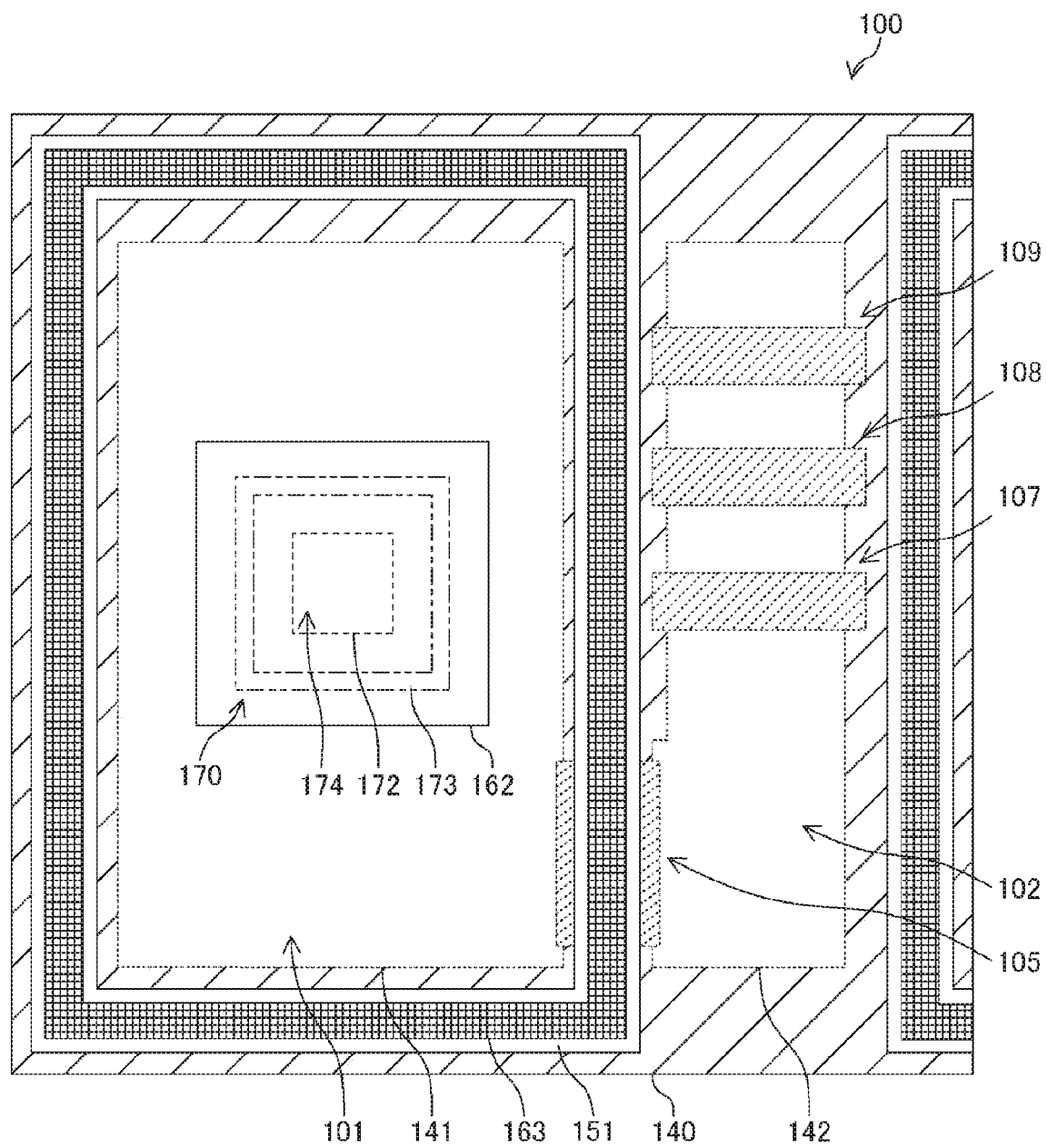
FIG. 18 is a diagram illustrating a configuration example of the pixel according to the fourth embodiment of the present technology.

FIG. 18 is a diagram illustrating a configuration example of the pixel according to the fourth embodiment of the present technology. FIG. 18 is a plan view representing the configuration of the pixel 100 as viewed from the back surface side, similarly to FIG. 4, and is a diagram representing an example of the arrangement of the photoelectric conversion unit 101, the first charge holding unit 102, and the MOS transistors 105 and 107 to 109 described with reference to FIG. 17.

The photoelectric conversion unit 101 is arranged on the left side of the pixel 100, and a gate and a drain region of the MOS transistor 105 are arranged in order adjacent to the lower right of the photoelectric conversion unit 101. A gate and a drain region of the MOS transistor 107 are arranged in order adjacent to the drain region of the MOS transistor 105. Here, the drain region of the MOS transistor 105 corresponds to a source region of the MOS transistor 107 and also constitutes the first charge holding unit 102. The gate and a source region of the MOS transistor 108 and a gate and a source region of the MOS transistor 109 are arranged in order adjacent to the drain region of the MOS transistor 107.

In the pixel 100 in FIG. 18 as well, a light-shielding wall 163 and a light-shielding film 161 are arranged around an n-type semiconductor region 141 of the photoelectric conversion unit 101. Furthermore, in a wiring region adjacent to the n-type semiconductor region 141 of the photoelectric conversion unit 101, the incident light attenuation unit 170 constituted by a lid portion 171, a wall portion 173, and a bottom portion 174 is arranged.

The configuration of the image sensor 1 other than the above-described configuration is similar to the configuration of the image sensor 1 described in the first embodiment of the present technology, and thus a description thereof will be omitted.

As described above, in an image sensor that performs imaging of the rolling shutter type, the image sensor 1 according to the fourth embodiment of the present technology can attenuate incident light transmitted through the photoelectric conversion unit 101 by the incident light attenuation unit 170. Stray light can be blocked from being incident onto the charge holding unit 102 and from being incident onto a pixel 100 in the adjacency, and the incidence of light transmitted through the photoelectric conversion unit 101 onto the charge holding unit, a pixel in the adjacency, and the like can be reduced.

5. Fifth Embodiment

In the image sensor 1 according to the first embodiment described above, the opening portion 172 of the lid portion 171 is arranged at a center portion of the photoelectric conversion unit 101. In contrast to this, an image sensor 1 according to a fifth embodiment of the present technology differs from the above-described first embodiment in that the position of an opening portion is adjusted.

[Circuit Configuration of Pixel]

Figure 19:
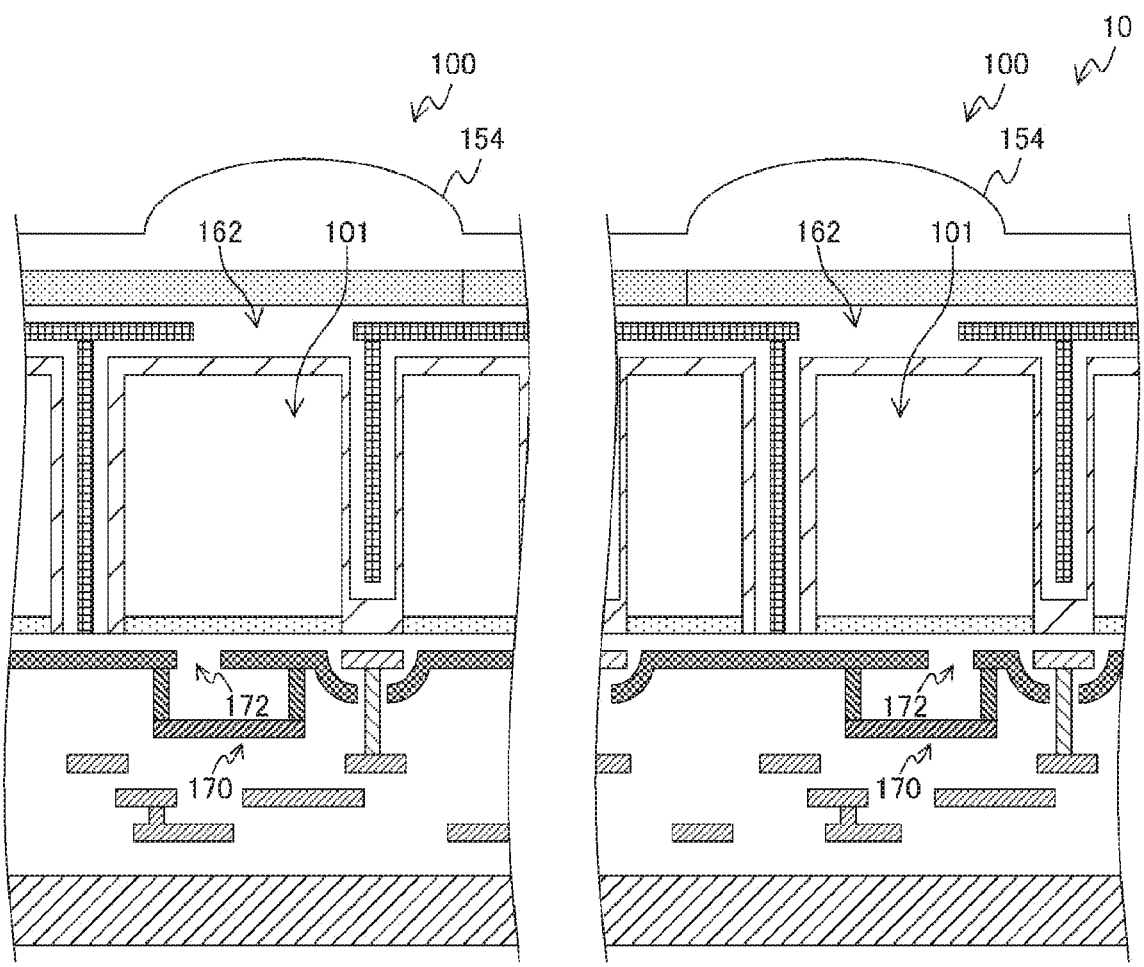
FIG. 19 is a diagram illustrating a configuration example of a pixel according to a fifth embodiment of the present technology.

FIG. 19 is a diagram illustrating a configuration example of a pixel according to the fifth embodiment of the present technology. FIG. 19 is a cross-sectional view representing a configuration example of the pixel 100, similarly to FIG. 3. The pixel 100 in FIG. 19 differs from the pixel 100 described with reference to FIG. 3 in that the position of an opening portion 172 of a lid portion 171 is altered according to the position of the pixel 100 in a pixel array unit 10.

The pixel 100 on the left side and the pixel 100 on the right side in FIG. 19 represent the configurations of pixels 100 arranged at a left end and a right end of the pixel array unit 10, respectively.

As represented in FIG. 19, in the pixel 100 arranged at the left end of the pixel array unit 10, an on-chip lens 154 and an opening portion 162 of a light-shielding film 161 are arranged closer to the right, and the opening portion 172 of the lid portion 171 is arranged closer to the left with respect to the photoelectric conversion unit 101. On the other hand, in the pixel 100 arranged at the right end of the pixel array unit 10, the on-chip lens 154 and the opening portion 162 of the light-shielding film 161 are arranged closer to the left, and the opening portion 172 of the lid portion 171 is arranged closer to the right with respect to the photoelectric conversion unit 101. Note that, in a pixel 100 arranged at a center portion of the pixel array unit 10, the on-chip lens 154 and the opening portions 162 and 172 are arranged at an approximate center portion of the photoelectric conversion unit 101. Then, the positions of the on-chip lens 154 and the opening portions 162 and 172 are adjusted by increasing the variation amount for the opening portion 172 and the like, for a pixel 100 arranged toward an end portion of the pixel array unit 10.

A subject is formed as an image on the image sensor 1 by a lens arranged outside. At this time, light from the subject is obliquely incident onto a pixel 100 arranged at an end portion of the pixel array unit 10. Thus, the positions of the on-chip lens 154 and the like are adjusted to collect the incident light on a center portion of the photoelectric conversion unit 101. Such a process of adjusting the positions of the on-chip lens 154 and the like is called pupil correction. At this time, since light transmitted through the photoelectric conversion unit 101 is also incident obliquely, the position of the opening portion 172 of the lid portion 171 is adjusted by shifting the position of the opening portion 172 according to the incident angle. With this configuration, it becomes possible to guide light transmitted through the photoelectric conversion unit 101 to the incident light attenuation unit 170 in the image sensor in which the pupil correction is performed.

The configuration of the image sensor 1 other than the above-described configuration is similar to the configuration of the image sensor 1 described in the first embodiment of the present technology, and thus a description thereof will be omitted.

As described above, in the image sensor 1 in which the pupil correction is performed, the image sensor 1 according to the fifth embodiment of the present technology can attenuate incident light transmitted through the photoelectric conversion unit 101 by the incident light attenuation unit 170. Stray light can be blocked from being incident onto the charge holding unit, and noise in the image signal can be decreased.

6. Application Example to Camera

The present technology can be applied to a variety of products. For example, the present technology may be implemented as an image sensor equipped on an imaging device such as a camera.

Figure 20:
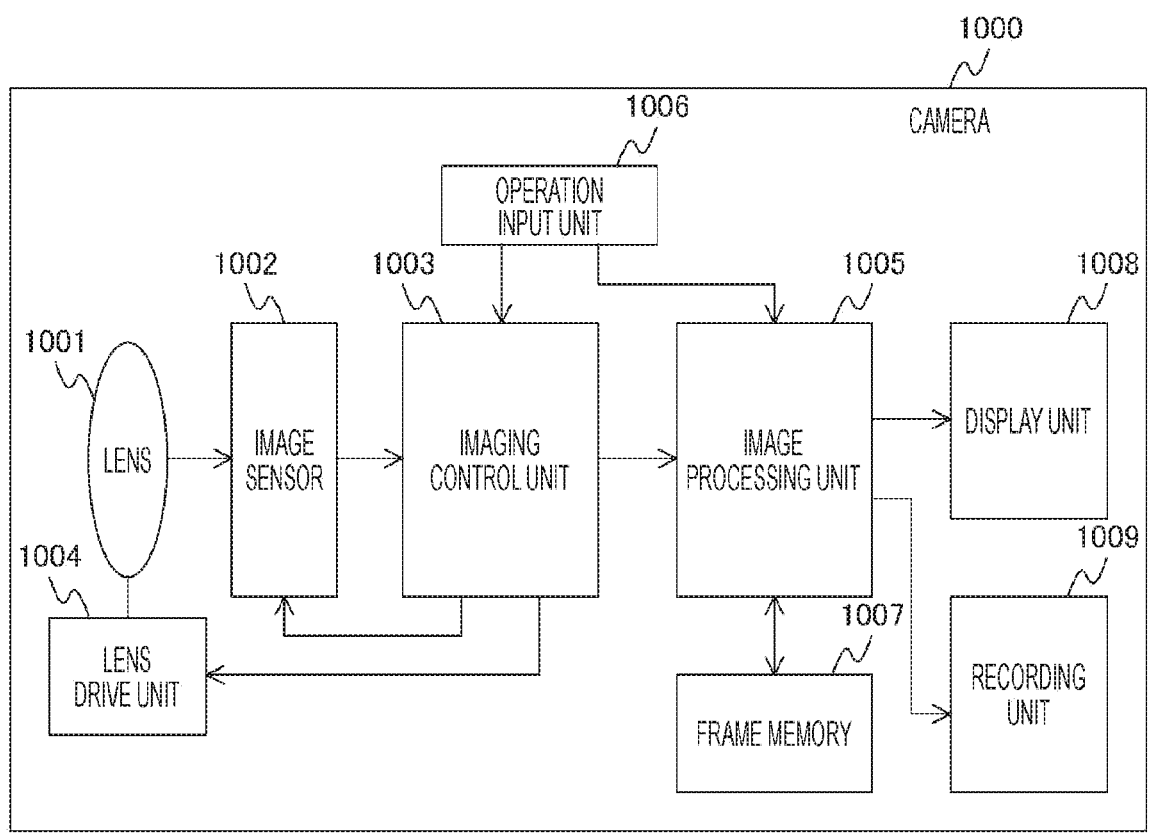
FIG. 20 is a block diagram illustrating an outline configuration example of a camera that is an example of an imaging device to which the present technology can be applied.

FIG. 20 is a block diagram illustrating an outline configuration example of a camera that is an example of an imaging device to which the present technology can be applied. The camera 1000 in FIG. 20 includes a lens 1001, an image sensor 1002, an imaging control unit 1003, a lens drive unit 1004, an image processing unit 1005, an operation input unit 1006, a frame memory 1007, a display unit 1008, and a recording unit 1009.

The lens 1001 is an image-capturing lens of the camera 1000. This lens 1001 collects light from a subject and makes the collected light incident onto the image sensor 1002 described later to form an image of the subject.

The image sensor 1002 is a semiconductor element that images light from the subject collected by the lens 1001. This image sensor 1002 generates an analog image signal according to irradiation light, and converts the generated analog image signal into a digital image signal to output the converted digital image signal.

The imaging control unit 1003 controls imaging in the image sensor 1002. This imaging control unit 1003 controls the image sensor 1002 by generating a control signal and outputting the generated control signal to the image sensor 1002. Furthermore, the imaging control unit 1003 can perform autofocus in the camera 1000 on the basis of the image signal output from the image sensor 1002. Here, the autofocus is a system that detects the focal position of the lens 1001 and automatically adjusts the detected focal position. As this autofocus, a technique of detecting the focal position by detecting an image plane phase difference by a phase difference pixel arranged in the image sensor 1002 (image plane phase difference autofocus) can be used. In addition, a technique of detecting a position where the contrast of the image is the highest, as the focal position (contrast autofocus) can also be applied. The imaging control unit 1003 adjusts the position of the lens 1001 via the lens drive unit 1004 on the basis of the detected focal position, and performs autofocus. Note that the imaging control unit 1003 can be constituted by, for example, a digital signal processor (DSP) equipped with firmware.

The lens drive unit 1004 drives the lens 1001 on the basis of the control of the imaging control unit 1003. This lens drive unit 1004 can drive the lens 1001 by altering the position of the lens 1001 using a built-in motor.

The image processing unit 1005 processes an image signal generated by the image sensor 1002. This process corresponds to, for example, demosaicing of generating an image signal of a missing color among image signals corresponding to red, green, and blue for each pixel, noise reduction of removing noise in the image signal, encoding of the image signal, and the like. The image processing unit 1005 can be constituted by, for example, a microcomputer equipped with firmware.

The operation input unit 1006 receives an operation input from a user of the camera 1000. For example, a push button or a touch panel can be used for this operation input unit 1006. The operation input received by the operation input unit 1006 is transported to the imaging control unit 1003 and the image processing unit 1005. Thereafter, a process according to the operation input, for example, a process such as imaging of a subject is activated.

The frame memory 1007 is a memory that stores a frame containing image signals making up one screen. This frame memory 1007 is controlled by the image processing unit 1005, and holds a frame in the course of an image process.

The display unit 1008 displays an image processed by the image processing unit 1005. For example, a liquid crystal panel can be used for this display unit 1008.

The recording unit 1009 records an image processed by the image processing unit 1005. For example, a memory card or a hard disk can be used for this recording unit 1009.

The camera to which the present invention can be applied has been described thus far. The present technology can be applied to the image sensor 1002 in the configuration described above. Specifically, the image sensor 1 described with reference to FIG. 1 can be applied to the image sensor 1002. By applying the image sensor 1 to the image sensor 1002, an image signal with less noise can be obtained. Note that the image processing unit 1005 is an example of the processing circuit described in the claims. The camera 1000 is an example of the imaging device described in the claims.

In addition, although the camera has been described here as an example, the technology according to the present invention may be applied to other imaging devices such as a monitoring device, for example.

Lastly, the description of each of the above embodiments is an example of the present technology, and the present technology is not limited to the above embodiments. For this reason, it goes without saying that various alterations can be made according to the design and the like, other than the respective embodiments described above, as long as the alterations do not depart from the technological idea of the present technology.

Note that the present technology can be also configured as described below.

(1) An image sensor including:
a pixel including a photoelectric conversion unit that is formed in a semiconductor substrate and performs photoelectric conversion based on incident light, and a pixel circuit that generates an image signal according to a charge generated by the photoelectric conversion;
a wiring layer that is arranged on a surface of the semiconductor substrate different from a surface onto which the incident light is incident and transports either the image signal or a signal applied to the pixel circuit; and
an incident light attenuation unit that attenuates the incident light transmitted through the photoelectric conversion unit.

(2) The image sensor according to (1) above, in which the incident light attenuation unit includes: a lid portion having an opening portion that is arranged between the semiconductor substrate and the wiring layer and allows light transmitted through the photoelectric conversion unit to be incident; and a wall portion enclosing the opening portion.

(3) The image sensor according to (2) above, in which the incident light attenuation unit includes the wall portion formed simultaneously with the wiring layer.

(4) The image sensor according to (2) above, in which the incident light attenuation unit further includes a bottom portion adjacent to the wall portion and arranged to face the lid portion.

(5) The image sensor according to (4) above, in which the incident light attenuation unit includes the bottom portion formed simultaneously with the wiring layer.

(6) The image sensor according to any one of (2) to (5) above, in which the opening portion is arranged in the incident light attenuation unit at a position shifted according to an incident angle of the incident light.

(7) The image sensor according to any one of (1) to (6) above, in which the pixel circuit includes a charge holding unit that holds the generated charge, and an image signal generation unit that generates an image signal on the basis of the held charge.

(8) The image sensor according to (7) above, further including a light-shielding wall that is arranged between the photoelectric conversion unit and the charge holding unit, and provides shielding from the incident light.

(9) The image sensor according to (7) or (8) above, further including a shading film that is arranged near the charge holding unit on a surface of the semiconductor substrate onto which the incident light is incident, and provides shielding from the incident light.

(10) An imaging device including:
a pixel including a photoelectric conversion unit that is formed in a semiconductor substrate and performs photoelectric conversion based on incident light, and a pixel circuit that generates an image signal according to a charge generated by the photoelectric conversion;
a wiring layer that is arranged on a surface of the semiconductor substrate different from a surface onto which the incident light is incident and transports either the image signal or a signal applied to the pixel circuit;
an incident light attenuation unit that attenuates the incident light transmitted through the photoelectric conversion unit; and
a processing circuit that processes the transported image signal.

REFERENCE SIGNS LIST 1, 1002 Image sensor
10 Pixel array unit
20 Vertical drive unit
30 Column signal processing unit
40 Control unit
100 Pixel
101 Photoelectric conversion unit
102 First charge holding unit
103 Second charge holding unit
105 to 109 MOS transistor
110 Image signal generation unit
120 Pixel circuit
130 Insulating layer
131 Wiring layer
132 Contact plug
133 Via plug
140 Semiconductor substrate
151 Isolation region
152 Insulating film
153 Color filter
154 On-chip lens
161 Light-shielding film
162, 164, 172, 175 Opening portion
163 Light-shielding wall
171 Lid portion
173 Wall portion
174 Bottom portion
176 Antireflection film
1000 Camera
1005 Image processing unit

The invention claimed is:
1. An image sensor, comprising:
a pixel including:

a photoelectric conversion unit configured to perform photoelectric conversion based on incident light, wherein the photoelectric conversion unit is in a semiconductor substrate, and a pixel circuit configured to generate an image signal based on a charge generated by the photoelectric conversion;

a wiring layer configured to transport either the image signal or a signal applied to the pixel circuit, wherein the wiring layer is on a surface of the semiconductor substrate different from a surface onto which the incident light is incident; and an incident light attenuation unit configured to attenuate the incident light transmitted through the photoelectric conversion unit, wherein the incident light attenuation unit includes:

a lid portion having an opening portion that is arranged between the semiconductor substrate and the wiring layer and allows light transmitted through the photoelectric conversion unit to be incident; and a wall portion enclosing the opening portion.

2. The image sensor according to claim 1, wherein the incident light attenuation unit includes the wall portion formed simultaneously with the wiring layer.

3. The image sensor according to claim 1, wherein the incident light attenuation unit further includes a bottom portion adjacent to the wall portion and arranged to face the lid portion.

4. The image sensor according to claim 3, wherein the incident light attenuation unit includes the bottom portion formed simultaneously with the wiring layer.

5. The image sensor according to claim 1, wherein the opening portion is arranged in the incident light attenuation unit at a position shifted according to an incident angle of the incident light.

6. The image sensor according to claim 1, wherein the pixel circuit further includes:

a charge holding unit configured to hold the generated charge, and an image signal generation unit configured to generate the image signal based on the held charge.

7. The image sensor according to claim 6, further comprising a light-shielding wall that is arranged between the photoelectric conversion unit and the charge holding unit, wherein the light-shielding wall provides shielding from the incident light.

8. The image sensor according to claim 6, further comprising a shading film that is arranged near the charge holding unit on a surface of the semiconductor substrate onto which the incident light is incident, wherein the shading film provides shielding from the incident light.

9. An imaging device, comprising:

a pixel including:

a photoelectric conversion unit configured to perform photoelectric conversion based on incident light, wherein the photoelectric conversion unit is in a semiconductor substrate, and a pixel circuit configured to generate an image signal based on a charge generated by the photoelectric conversion;

a wiring layer configured to transport either the image signal or a signal applied to the pixel circuit, wherein the wiring layer is on a surface of the semiconductor substrate different from a surface onto which the incident light is incident;

an incident light attenuation unit configured to attenuate the incident light transmitted through the photoelectric conversion unit, wherein the incident light attenuation unit includes:

a lid portion having an opening portion that is arranged between the semiconductor substrate and the wiring layer and allows light transmitted through the photoelectric conversion unit to be incident; and a wall portion enclosing the opening portion; and a processing circuit configured to process the transported image signal.

* * * * *